United States Patent
Jones, III

(10) Patent No.: US 10,243,271 B2
(45) Date of Patent: Mar. 26, 2019

(54) QUASI STATIC ANTENNA DESIGN FOR A NON-SYMMETRIC ELECTRICALLY SMALL ANTENNA HAVING NON-SYMMETRIC ENCLOSING SURFACES

(71) Applicant: SPAWAR Systems Center Pacific, San Diego, CA (US)

(72) Inventor: Thomas O. Jones, III, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/284,549

(22) Filed: Oct. 4, 2016

(65) Prior Publication Data

US 2018/0097289 A1    Apr. 5, 2018

(51) Int. Cl.
| | |
|---|---|
| *H01Q 9/28* | (2006.01) |
| *G06F 17/50* | (2006.01) |
| *H01Q 9/40* | (2006.01) |
| *H01P 11/00* | (2006.01) |

(52) U.S. Cl.
CPC ........... *H01Q 9/28* (2013.01); *G06F 17/5036* (2013.01); *H01P 11/00* (2013.01); *H01Q 9/40* (2013.01)

(58) Field of Classification Search
CPC ...................................................... H01Q 9/28
See application file for complete search history.

(56) References Cited

U.S. PATENT DOCUMENTS

| | | |
|---|---|---|
| 8,121,821 B1 | 2/2012 | Jones |
| 8,368,156 B1 | 2/2013 | Jones, III |
| 9,053,268 B1 | 6/2015 | Jones, III |
| 9,595,747 B1 * | 3/2017 | Jones, III ............ G06F 17/5036 |

OTHER PUBLICATIONS

Ignatenko, Maxim, and Dejan S. Filipovic. "On the design of vehicular electrically small antennas for NVIS communications." IEEE Transactions on Antennas and Propagation 64, No. 6 (2016): 2136-2145. (Year: 2016).*
Behdad, Nader, and Mudar A. Al-Joumayly. "A generalized synthesis procedure for low-profile, frequency selective surfaces with odd-order bandpass responses." IEEE Transactions on Antennas and Propagation 58, No. 7 (2010): 2460-2464. (Year: 2010).*
Stuart, Howard R., and Alex Pidwerbetsky. "Electrically small antenna elements using negative permittivity resonators." In Antennas and Propagation Society International Symposium, 2005 IEEE, vol. 1, pp. 676-679. IEEE, 2005. (Year: 2005).*
"A Quasistatic Antenna Design Approach for Minimum-Q Antennas", Jones, Thomas O. III, IEEE Antenna and Propagation Magazine, vol. 53, No. 3, Jun. 2011.

* cited by examiner

*Primary Examiner* — Aniss Chad
(74) *Attorney, Agent, or Firm* — SPAWAR Systems Center Pacific; Kyle Eppele; J. Eric Anderson

(57) ABSTRACT

A quasi-static antenna design is generated for an electrically small non-symmetric dipole antenna having enclosing surfaces that are not symmetrical with the contours of the dipole arms. The shapes of the enclosing surfaces are predefined. The antenna design is selected from among a set of antenna designs, each antenna design having a unique charge distribution geometry and charge distribution properties. The antenna design is selected that produces a desired capacitance, a desired radiation, resistance, and/or a desired Q-factor.

10 Claims, 33 Drawing Sheets

QUASI STATIC ANTENNA DESIGN FOR A NON-SYMMETRIC ELECTRICALLY SMALL ANTENNA HAVING NON-SYMMETRIC ENCLOSING SURFACES

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil, referencing NC 103200.

FIELD OF THE INVENTION

The present invention pertains generally to antennas. More particularly, the present invention pertains to a quasi-static antenna design for a non-symmetric electrically small antenna having non-symmetric enclosing surfaces.

BACKGROUND OF THE INVENTION

In 1947, H. A. Wheeler published formulas for qualifying the antenna radiation (Q) for electrically small antenna in terms of the antenna's physical size. Shortly thereafter, L. J. Chu published additional formulas and theories on the subject, also using the antenna's size as a metric. As the Q of an antenna is inversely related to the antenna's frequency response, of significant interest to antenna engineers is the theoretical Q limits imposed by Wheeler and Chu for given antenna dimensions. Numerous scientists have attempted to corroborate and expand on these dimension-based formulas in terms of actual measurements of scale models, computational models, or revised formulas base on electrical parameters, with some degree of success. However, these approaches have typically yielded solutions that are either very cumbersome or do not provide an elegant approach for designing low Q antennas.

Therefore, there has been a long-standing need in the antenna community for simpler methods and systems for designing wide bandwidth antennas, based on a low Q criterion.

SUMMARY OF THE INVENTION

According to an illustrative embodiment, a method is provided for designing an electrically small asymmetric dipole antenna. The method includes determining a capacitance, a radiation resistance, and a Q factor for each dipole antenna design among a set of dipole antenna designs. The Q factor for each dipole antenna design is determined as a function of the capacitance and the radiation resistance. Each dipole antenna design has a unique charge distribution geometry and charge distribution properties. The shapes of a top enclosing surface enclosing the top arm and a bottom enclosing surface enclosing the bottom arm are predefined. The predefined shape of the top enclosing surface is not symmetrical with a contour of the top arm, and the predefined shape of the bottom enclosing surface is not symmetrical with a contour of the bottom arm, allowing for optimal use of the top and bottom enclosing volumes. A dipole antenna design is selected from among the set of dipole antenna designs that produces at least one of a desired capacitance, a desired radiation resistance, and a desired Q factor.

BRIEF DESCRIPTION OF THE DRAWINGS

The features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

Figure 1:
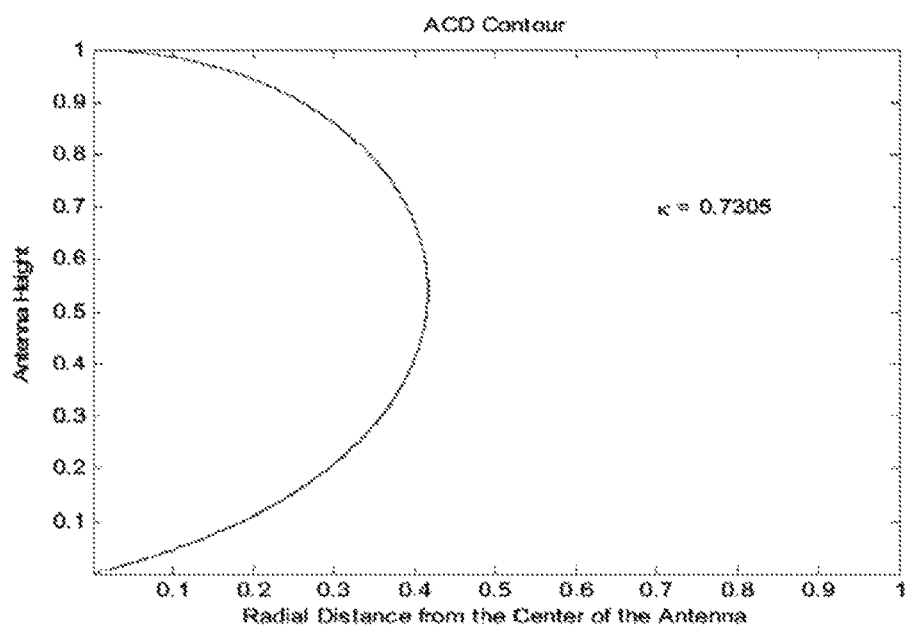
FIG. 1 is an illustration of the contour of an exemplary ACD antenna according to an embodiment of this invention.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that such subject matter may be practiced without these specific details.

According to an illustrative embodiment, a design is provided for a quasi-static asymmetric electrically small dipole antenna having asymmetric enclosing surfaces. That is, the contour of the top arm is not symmetric with the contour of the bottom arm. Additionally, the enclosing surface for the top arm is not symmetric with the contour of the top arm, and the enclosing surface for the bottom arm is not symmetric with the contour of the bottom arm. By allowing the enclosing surfaces not to be symmetric with the contours of the top arm and the bottom arm, more of the enclosing volumes is available for use, which results in a smaller Q-factor.

According to an illustrative embodiment, the antenna design that is chosen is the design that produces a desired capacitance, a desired radiation resistance, and/or a desired Q factor. The capacitance for each antenna design is determined based on the unique charge distribution for that antenna design. The radiation resistance for each antenna design is computed based, in part, on a radius of the bottom enclosing surface. The Q-factor for each antenna design is computed as a function of the radiation resistance and the capacitance.

Though a small Q-factor may be desirable, the antenna design chosen need not be limited to that which produces the smallest Q-factor. The desirability of the capacitance and the radiation resistance may also be taken into account.

As a precursor to a further detailed description of the embodiment which is the subject of this disclosure, given below under the Section entitled "Dipole with Asymmetric Enclosing Surfaces", an introduction to quasi-static antenna design first follows to aid in understanding the invention. Further details of this introduction to quasi-static antenna design may be found, for example, in commonly assigned U.S. Pat. Nos. 8,121,821, 8,368,156, and 9,053,268.

Quasi-Static, Low Q Derivation

The radiation Q of an antenna is defined as the ratio of the average stored energy to the average radiated energy, and is usually understood as a metric for qualifying the radiation efficiency of the antenna. This important relationship can be expressed as:

$$Q = \omega E_s / E_r, \quad (1)$$

where $E_r$ is the radiated energy and $E_s$ is the stored energy.

For an electrically small antenna, the antenna behaves very much like a capacitor, exhibiting quasi-static field behavior, and consequently the instantaneous stored energy $E_s$ can be expressed in terms of the well-known quasi-static relationship:

$$E_s = \frac{1}{2} V q_{peak}, \quad (2)$$

where V is the voltage and $q_{peak}$ is the charge.

For a time-harmonic current signal $I(t) = I_{peak} \sin(\omega t)$, Eq. 2 can be recast as $$E_s = \frac{I_{peak}^2}{2C\omega^2}, \quad (3)$$

where C is the capacitance, $\omega$ is the radian frequency ($2\pi f$). If $I(t)$ is expressed as an rms current ($I_{rms}$), which is equivalent to an average static current, then the average stored energy $E_s$ in a capacitor can be expressed as:

$$E_s = \frac{I_{rms}^2}{C\omega^2}, \quad (4)$$

The radiated energy $E_r$ in the capacitor can be expressed as:

$$E_r = R_r I_{rms}^2, \quad (5)$$

where $R_r$ (also referred to herein as $R_{rad}$) is the resistance in terms of real radiation.

By using the earlier definition of Q (Eq. 1) and combining the above expressions, the following relationship can be developed:

$$Q = \frac{1}{\omega C R_r}. \quad (6)$$

The above Eq. 6 expresses the Q for a quasi-static field about an electrically small antenna, in terms of electrical parameters of the antenna. However, to be able to arrive at the antenna's electrical parameters as expressed in Eq. 6, the significance of the antenna's shape and its effect on charge distribution must be developed.

It is well understood that the charge on a perfectly conducting antenna is distributed about the surface of the antenna. Since there is an intrinsic relationship between the electric field generated by a source charge, the electric field on the surface of the antenna can be expressed as a function of the distribution of the source charges. For the quasi-static case, this relationship can generally be expressed as:

$$\Phi = \iiint_v \frac{q}{4\pi\varepsilon_0 r_{dist}} dv, \quad (7)$$

where $\Phi$ is the electric field potential, q is the charge, c is the permittivity, and $r_{dist}$ is the distance between the observer and the charge distribution.

For a perfectly conducting surface, the scalar potential is constant, therefore, a solution can be developed for Eq. 7 describing the exact charge distribution on the antenna surface. Therefore, given a simple shape, the charge distribution and attendant antenna parameters can usually be found using a direct, closed form solution. However, due to the complex shapes of most antennas, an indirect solution using numerical techniques must often be employed. As one of ordinary skill in the art can appreciate, numerous researchers have devoted their studies to solving Eq. 7 for assorted geometries and therefore there are a plethora of publications dedicated to this subject matter. These prior art approaches predominately pre-define a shape and thereafter derive a solution from the shape.

For some embodiments of the exemplary methods and apparatuses demonstrated herein, the charge distribution is pre-defined and thereafter the shape of the antenna is generated, based on the corresponding solution. To provide a degree(s) of freedom in the shaping of the antenna, a factor K, which operates as dimension variable(s) and charge distribution parameter(s), is inserted into the defining equation(s). From a solution of the defining equation(s), the respective Q-related parameters can be generated to form an expression for Q. Since K is a variable in the Q expression, it can operate as a solution for a given value of Q. Therefore, varying values of K will result in varying values of Q. If the Q expression is minimized, then the corresponding value of K will define a minimum Q antenna. Accordingly, antennas with minimum or otherwise low Q values can be designed by this exemplary method. The application of the exemplary method described will be demonstrated by example below, as derived from differing charge distributions. It should be noted that by use of the exemplary methods and apparatuses described herein, several novel antennas having very low Q values have been developed.

ACD

The Asymptotic Conical Dipole (ACD), sometimes referred to as a Hertzian monopole, is developed, having a constant charge distribution and a constant image charge distribution along its vertical axis. The charge distribution has a length L, and is given a total charge q running from $z=-L/2$ to $z=+L/2$. The scalar potential $\Phi$ for this charge distribution is defined from the following cylindrical equation:

$$\Phi(\rho, z) = \frac{q}{4\pi\varepsilon_0 L} \ln\left(\frac{1+\tau}{1-\tau}\right), \quad (8)$$

where $\varepsilon_0$ = free space permittivity, $$\tau = \frac{L}{R_1 + R_2},$$

$R_1 = \sqrt{(z-L/2)^2 + \rho^2}$, and $R_2 = \sqrt{(z-L/2)^2 + \rho^2}$.

On the z-axis, this equations simplifies to $$\tau = \frac{L}{|2z|}$$

for $|z| > |L/2|$. If h is the actual height of the antenna, we can devise a dimensional variable $\kappa$ such that $\kappa = L/h$. Therefore, the charge distribution per unit length is $q/Kh$. Using this substitution and incorporating image theory, Eq. 8 can be rewritten as:

$$\Phi(\rho, z) = \frac{q}{4\pi\varepsilon_0 \kappa h} \ln\left(\frac{(1+\tau_m)(1-\tau_i)}{(1-\tau_m)(1+\tau_i)}\right), \quad (9)$$

where $$\tau_m = \frac{\kappa h}{R_f + R_t}$$

is for the monopole, $$\tau_i = \frac{\kappa h}{R_f + R_b}$$

is for the image monopole, $R_t = \sqrt{(z-\kappa h)^2 \rho^2}$ is the distance from $\rho$, z to the top of the monopole, $R_f = \sqrt{z^2 + \rho^2}$ is the distance from $\rho$, z to the feed point and $R_b = \sqrt{(z+\kappa h)^2 + \rho^2}$ is the distance from $\rho$, z to the bottom of the image monopole.

It is noted that Eq. 9 expresses the electric potential $\Phi$ with the dimensional variable K embedded within. The capacitance can be calculated by first evaluating the above $R_t$, $R_f$, and $R_b$ equations at the point $\rho=0$, $z=h$, which is known to be location of the maximum potential location, to result in $R_t=(z-\kappa h)$, $R_f=z$, $$R_b = (z + \kappa h), \tau_m = \frac{\kappa h}{2z - \kappa h}, \text{ and } \tau_i = \frac{\kappa h}{2z + \kappa h} \quad$$

for $z \geq \kappa h$. Substituting these values into Eq. 9 yields:

$$\Phi(\rho, z) = \frac{q}{4\pi\varepsilon_0 \kappa h} \ln\left(\frac{z^2}{(z - \kappa h)(z + \kappa h)}\right). \quad (10)$$

Further evaluating this expression at $\rho=0$, $z=h$ results in $$\Phi(0, h) = -\frac{q}{4\pi\varepsilon_0 \kappa h} \ln(1 - \kappa^2). \quad (11)$$

Since $q=C\Phi$, then the capacitance is $$C(\kappa) = \frac{4\pi\varepsilon_0 \kappa h}{-\ln(1 - \kappa^2)}. \quad (12)$$

The effective height $h_e$ for the line charge distribution is $h_e=\kappa h/2$. The radiation resistance $R_r$ is $$R_r(\kappa) = 40\left(\frac{\kappa h k}{2}\right)^2, \quad (13)$$

where k is the wave number ($2\pi/\lambda$). The Q can now be expressed as $$Q(\kappa) = \frac{-3\ln(1 - \kappa^2)}{(\kappa h k)^3}. \quad (14)$$

It should be noted that the quantities C, $R_r$, and Q depend on the wave number k and the height h, which can be fixed as constants. A minimum value of Q can be found by taking the derivative of Eq. 14 and setting it to zero resulting in $$\frac{d(-\ln(1 - \kappa^2)/\kappa^3)}{d\kappa} = \quad (15)$$

$$\frac{1}{\kappa^4(1-\kappa^2)}[(2 - 3\ln(1 - \kappa^2))\kappa^2 + 3\ln(1 - \kappa^2)] = 0.$$

As this is a non-trivial equation, Eq. 15 can be solved by any one of several methods of numerical iteration, that are well known in the art, to finally result in $\kappa=0.7304719548370$.

This value of $\kappa$ can now define the dimensional aspects of an antenna that conforms to a constant line charge distribution as defined above. Additionally, as it was derived from a minimized Q relationship, it also defines the dimensional aspects of an antenna that has a minimum Q. Of course, if a non-minimum solution was sought, then Eq. 14 would be evaluated for different values of $\kappa$, to provide a spectrum of Q values. Accordingly, different antenna shapes would result from the different K's, corresponding to different Q values.

In summary, the antenna parameters for the ACD are:

$$Q = \frac{5.87}{(kh)^3}$$

$$h_e = .3652h$$

$$R_r = 5.336(hk)^2$$

$$C = 1.064 * 10^{-10} h$$

Based on the minimum $\kappa$ value, and for a given k and h, the contour of an exemplary ACD antenna was generated. FIG. 1 is an illustration of a cross-sectional view of the exemplary ACD antenna.

$P_1$ Legendre Polynomial Charge Distribution

Various current distribution functions, in addition to a constant line charge, can be chosen, according to design preference. Accordingly, in this exemplary embodiment, a first order Legendre Polynomial ($P_1$) charge distribution is used on a monopole antenna. The $P_1$ charge distribution is linear and defined on the z axis from $z=-L/2$ to $z=+L/2$. The static potential equation for this charge in cylindrical coordinates is $$\Phi(\rho, z) = \int_{-L/2}^{L/2} \frac{P_1(2x/L)}{\sqrt{(x-z)^2 + \rho^2}} dx = \frac{2z}{L}\left(\ln\left(\frac{1+\tau}{1-\tau}\right) - 2\tau\right), \quad (17)$$

where $$\tau = \frac{L}{R_1 + R_2},$$

is the length, $R_1=\sqrt{(z-L/2)^2+\rho^2}$ and $R_2=\sqrt{(z+L/2)^2+\rho^2}$.

If h is the height of the antenna, the line charge must be less than h by a factor $\kappa<1$. The above Eq. 17 represents the potential field for both the monopole and its image, that is, $L=2\kappa h$.

Our assumption is that the total charge on the monopole is q. The required scale factor, $2q/\kappa h$, that enables this assumption is $$q = \frac{2q}{\kappa h} \int_0^{\kappa h} P_1(z/\kappa h) dz. \quad (18)$$

With Eq. 18, the resulting potential field equation becomes $$\Phi(\rho, z) = \frac{2q}{4\pi\varepsilon_0 \kappa h} \frac{z}{\kappa h}\left(\ln\left(\frac{1+\tau}{1-\tau}\right) - 2\tau\right), \quad (19)$$

where $$\tau = \frac{2\kappa h}{R_1 + R_2},$$

$R_1 = \sqrt{(z-\kappa h)^2 + \rho^2}$ and $R_2 = \sqrt{(z+\kappa h)^2 + \rho^2}$. The maximum potential is known to be at $z=h$ and $\rho=0$ resulting in the simplified expression $$\Phi(0, h) = \frac{2q}{4\pi\varepsilon_0 \kappa^2 h}\left(\ln\left(\frac{1+\kappa}{1-\kappa}\right) - 2\kappa\right). \quad (20)$$

Using principles described in solving for the ACD antenna, the capacitance becomes $$C(\kappa) = 4\pi\varepsilon_0 \frac{\kappa^2 h}{2\left(\ln\left(\frac{1+\kappa}{1-\kappa}\right) - 2\kappa\right)}. \quad (21)$$

Given that the effective height for the $P_1$ charge distribution is $h_e = 2\kappa h/3$. The radiation resistance is $$R_r(\kappa) = 40\left(\frac{2\kappa hk}{3}\right)^2, \text{ and } Q \text{ is} \quad (22)$$

$$Q(\kappa) = \frac{27\left(\ln\left(\frac{1+\kappa}{1-\kappa}\right) - 2\kappa\right)}{8(hk)^3 \kappa^4}. \quad (23)$$

Again, Q is found to be formulated in terms of is κ k and h. Eq. 23 can be minimized by taking its derivative and setting it to zero:

$$\frac{dQ}{d\kappa} = \frac{27}{4(kh)^3}\left(\frac{\frac{2}{\kappa}\ln\left(\frac{1+\kappa}{1-\kappa}\right) - 3}{(1-\kappa^2)\kappa^5}\right)\left[\kappa^2 - \left(1 - \frac{1}{\frac{2}{\kappa}\ln\left(\frac{1+\kappa}{1-\kappa}\right) - 3}\right)\right] = 0. \quad (24)$$

The term in the square bracket can be solved by iteration; the quantity, $$\frac{2}{\kappa}\ln\left(\frac{1+\kappa}{1-\kappa}\right) - 3$$

being a slowly changing function, The solution is found to be κ=0.69609037983344.

In summary, the parameters for this exemplary antenna become:

$$Q = \frac{4.7031}{(hk)^3} \quad (25)$$

$h_e = .46406h$ $R_r = 8.614(kh)^2$ $C = 8.22178 * 10^{-11} h$

The radiation resistance for this exemplary $P_1$ charge antenna is 60% higher than the exemplary constant charge ACD antenna and the Q is 20% lower. This is offset by a 23% decrease in the capacitance of the antenna.

Figure 2:
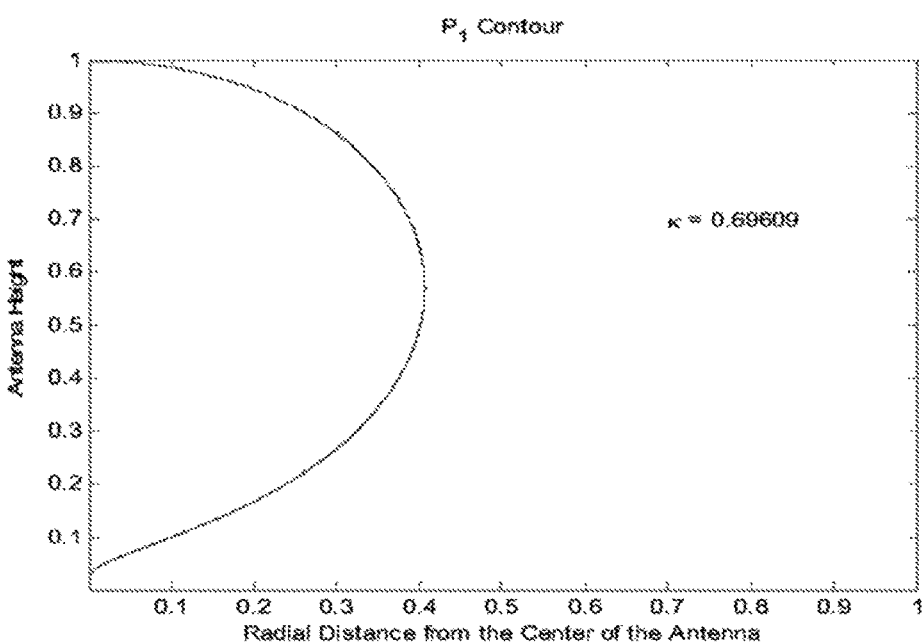
FIG. 2 is an illustration of the contour of an exemplary $P_1$ charge antenna, according to an embodiment of this invention.
Figure 3:
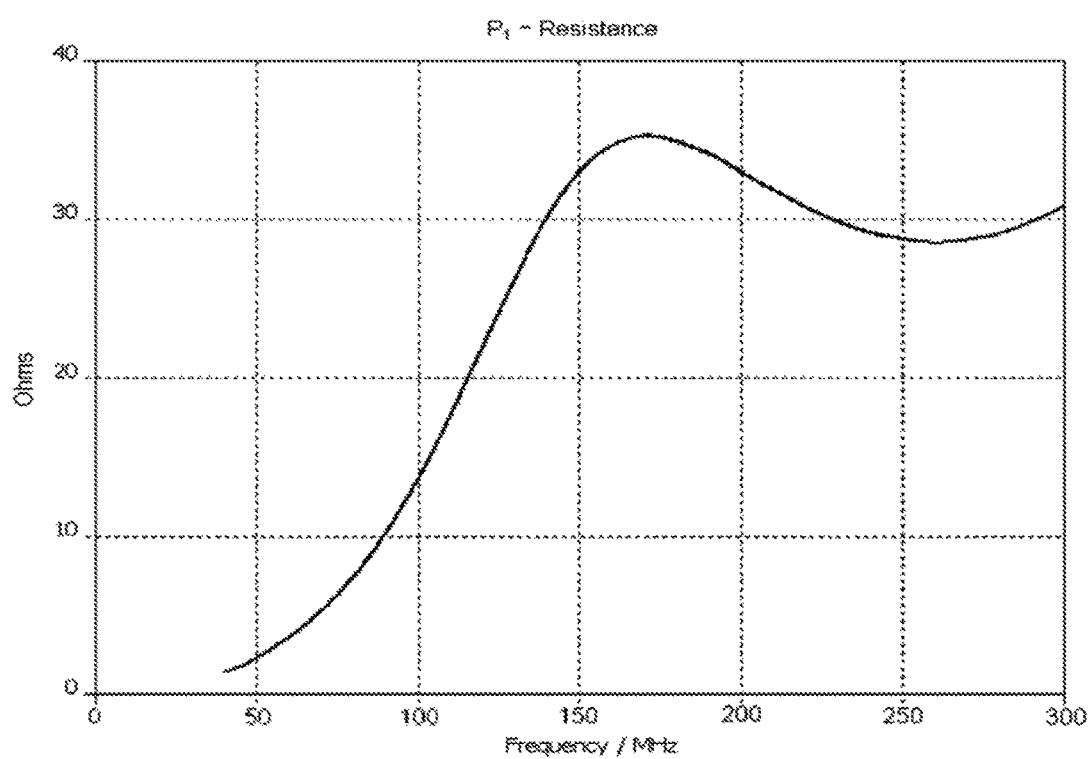
FIG. 3 is a graph of the computed resistance of an exemplary $P_1$ charge antenna, according to an embodiment of this invention.
Figure 4:
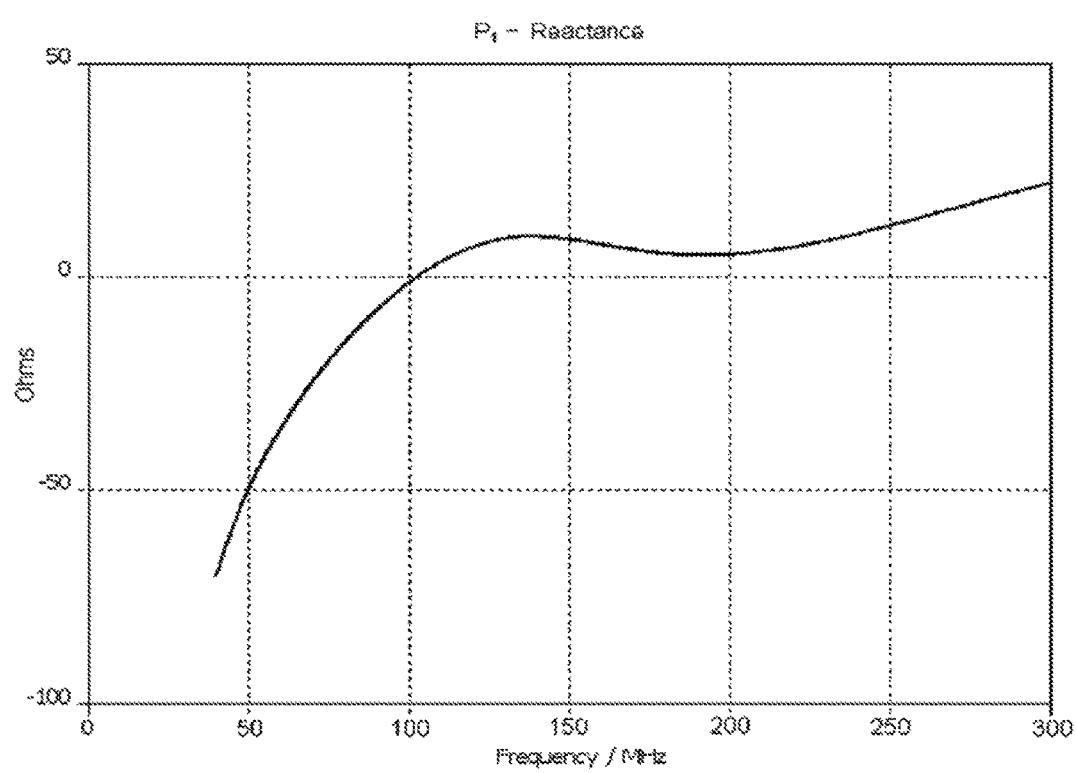
FIG. 4 is a graph of the computed reactance of an exemplary $P_1$ charge antenna, according to an embodiment of this invention.
Figure 5:
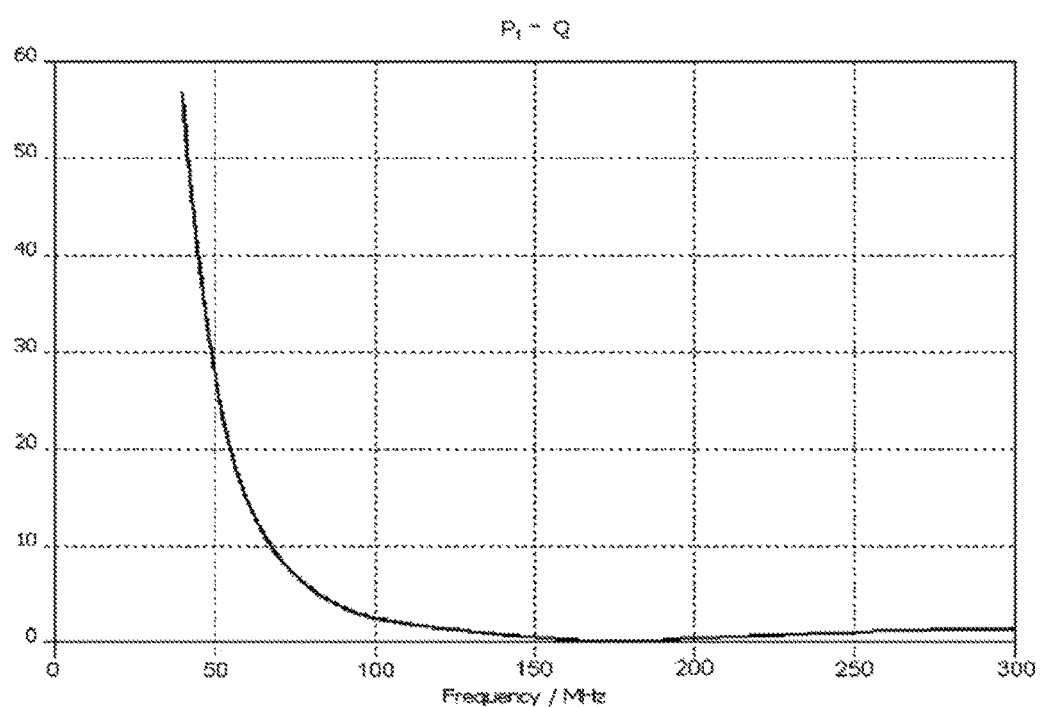
FIG. 5 is a graph of the computed Q-factor of an exemplary $P_1$ charge antenna, according to an embodiment of this invention.

Using a K value of 0.69609, a contour of the exemplary $P_1$ charge antenna was generated. FIG. 2 is a cross-sectional illustration of the exemplary $P_1$ charge antenna. In addition to generating the contour, a numerical model was created to simulate the exemplary $P_1$ charge antenna's response using Numerical Electromagnetic Code (NEC) and also Computer Simulation Technology (CST) Microwave Studio®. These simulations were performed using varying values of κ, the CST computed minimum being 0.69609. The results of the simulation are shown in FIG. 3, which is a graph showing the computed resistance of the exemplary $P_1$ charge antenna as a function of frequency, for a κ value of 0.69609. FIG. 4 is a graph showing the computed reactance of the exemplary $P_1$ charge antenna as a function of frequency, for the same κ value. And FIG. 5 is a graph showing the computed charge distribution of the exemplary $P_1$ charge antenna as a function of frequency, again for the same κ value.

Figure 6:
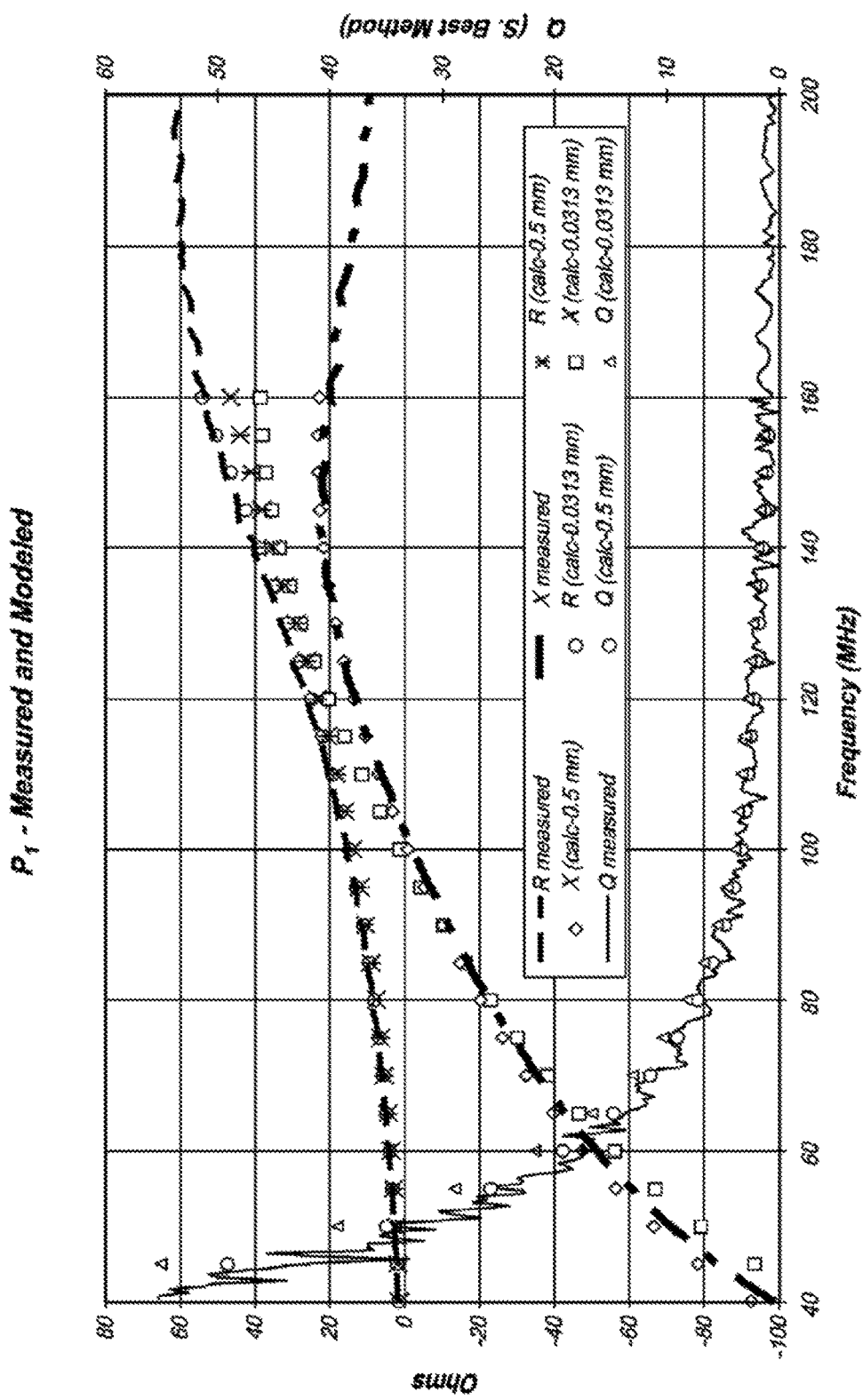
FIG. 6 is a graph comparing experimental measurements of an exemplary $P_1$ charge antenna to computer simulated/predicted values, according to an embodiment of this invention.

Based on the results tabulated above, a half meter physical model was constructed of wires and experimental measurements were performed. FIG. 6 details the comparison of the physical model measurements to the computer simulated/predicted values. It is noted that the measured and computed values appear to track reasonably well throughout the experiment.

It should be noted that typical antennas are known to exhibit anti-resonance or poor radiation characteristics at frequencies that are one half wavelength the longest dimension of the antenna. Examination of FIG. 6 shows that the response is very smooth throughout the one half wavelength region. Therefore, this exemplary $P_1$ charge antenna does not suffer from typical half wavelength anti-resonance problems.

$P_0$+Point Charge Antenna

Progressing from the exemplary $P_1$ charge antenna, another charge distribution was evaluated. A "bulb" antenna charge distribution was generated, using a constant line charge distribution ($Q_0$) with a point charge at the end of the constant line charge distribution. In essence, the bulb antenna charge distribution is the charge distribution of the constant line charge ACD antenna modified with a point charge at the top.

The total charge q is split between the line charge and the point charge, with the point charge being αq and the line charge being (1−α)q/κh, where α is a proportionality constant. Using similar dimensional constraints as imposed in the constant line charge ACD antenna, the expression for the potential field distribution becomes $$\Phi(\rho, z) = \frac{(1-\alpha)q}{4\pi\varepsilon_0 \kappa h}\ln\left(\frac{(1+\tau_m)(1-\tau_i)}{(1-\tau_m)(1+\tau_i)}\right) + \frac{\alpha q}{4\pi\varepsilon_0 R_t} - \frac{\alpha q}{4\pi\varepsilon_0 R_b}. \quad (26)$$

This potential is known to be maximum at $\rho=0$ and $z=h$, resulting in Eq. 26 being recast as $$\Phi(0, h) = \frac{-(1-\alpha)q}{4\pi\varepsilon_0 \kappa h}\ln(1-\kappa^2) + \frac{2\alpha\kappa q}{4\pi\varepsilon_0 h(1-\kappa^2)}. \quad (27)$$

The capacitance can be found to be $$C(\kappa, \alpha) = \frac{4\pi\varepsilon_0 \kappa h}{-(1-\alpha)\ln(1-\kappa^2) + \frac{2\alpha\kappa^2}{(1-\kappa^2)}}. \quad (28)$$

The effective height $h_{\text{eff}}$ is $$h_{\text{eff}}(\kappa,\alpha) = (1+\alpha)\kappa h/2. \quad (29)$$

The radiation resistance is $$R_r(\kappa,\alpha) = 10[\kappa h k(1+\alpha)]^2. \quad (30)$$

Using free space, the resulting Q expression becomes $$Q(\alpha, \kappa) = \frac{3}{(1+\alpha)^2 (\kappa kh)^3}\left[\frac{2\alpha\kappa^2}{(1-\kappa^2)} - (1-\alpha)\ln(1-\kappa^2)\right]. \quad (31)$$

The minimum value is found by numerically evaluating Eq. 31 for a range of values at 50 MHz. The value of $\kappa$ for the minimum Q is given in the following Table 1.

TABLE 1

| α | κ | MinimumQ | R | C |
|---|---|---|---|---|
| 0.5 | 0.609 | 33.77 | 2.29 | 41.2 pF |
| 0.6 | 0.600 | 32.26 | 2.53 | 39.1 pF |
| 0.7 | 0.593 | 30.84 | 2.79 | 37.0 pF |
| 0.8 | 0.587 | 29.52 | 3.06 | 35.2 pF |
| 0.9 | 0.582 | 28.29 | 3.35 | 33.5 pF |
| 0.99 | 0.578 | 27.26 | 3.63 | 32.2 pF |

Using the α value of 0.9 (meaning 90% of the total charge on the point) the "bulb" antenna parameters are $$Q = \frac{4.061}{(kh)^3}$$

$$h_e = 0.5529h$$

$$R_r = 12.22 * (kh)^2$$

$$C = 6.7 * 10^{-11}h$$

Figure 7:
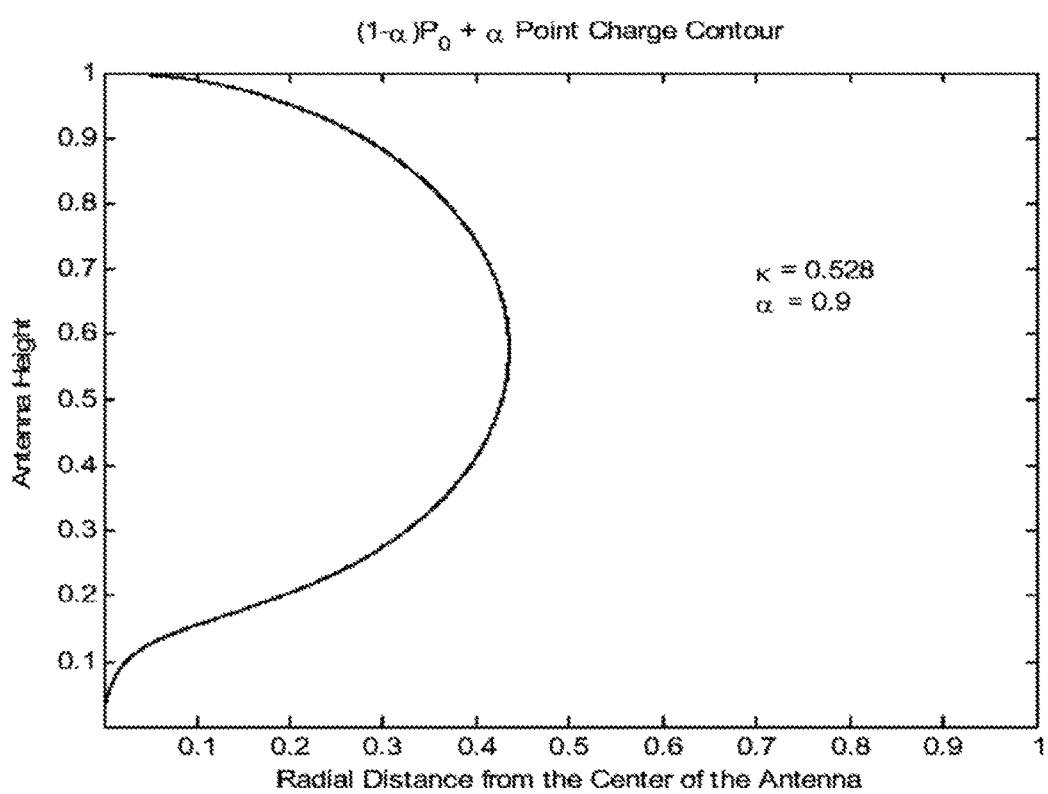
FIG. 7 is an illustration of the contour of an exemplary $(1-\alpha) P_0+\alpha$ point charge antenna, according to an embodiment of this invention.

Of interesting note is that the Q value is diminishing, as compared to the previous exemplary antennas. FIG. 7 is an illustration of a cross-sectional view of the exemplary $(1-\alpha)$ $P_0+\alpha$ point charge ("bulb") antenna demonstrated herein. Also, as a means of validation, this exemplary antenna model exhibited similar characteristics to a "bulb" antenna modeled by R. M. Kalafus, with the principal exception that Kalafus' antenna uses a finite feed point.

A comparison of the Q performance was also made to Chu's theoretical minimum. Chu expresses the theoretical minimum Q of an antenna as $$Q_{Chu} = \frac{1}{(kh)^3} + \frac{1}{kh}. \quad (32)$$

Figure 8:
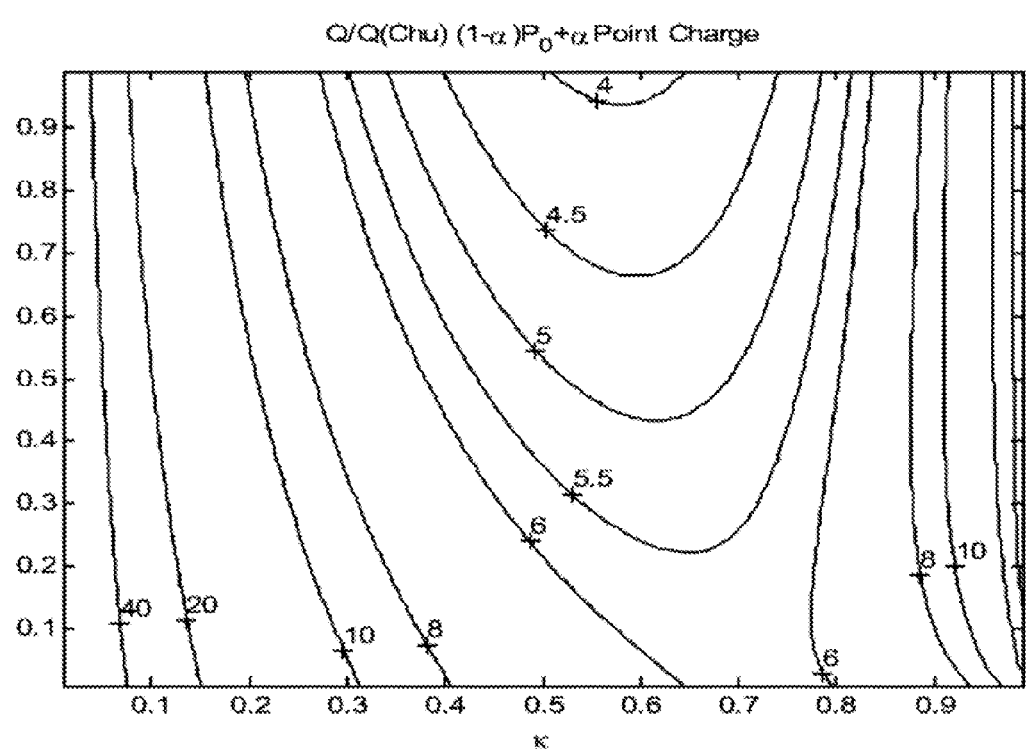
FIG. 8 is a graph of the $Q/Q_{Chu}$ ratio as a function of $\alpha$ and $\kappa$ for an exemplary $(1-\alpha) P_0+\alpha$ point charge antenna, according to an embodiment of this invention.

Using Eq. 6, and the first term in Eq. 32, a comparison of the $Q/Q_{Chu}$ ratio for the above exemplary antenna was made, for varying values of a, as a function of K. FIG. 8 is a plot of this comparison.

$P_1$+Point Charge Antenna

The above demonstrated exemplary $P_0$+point charge model can be modified by using a $P_1$ feed line rather than a constant feed line. As previously described, the $P_1$ charge distribution is a "linear" charge distribution versus a "constant" charge distribution, as in the case of $P_0$. For this formulation, the net charge q is split between the linear charge and the point charge with the point charge quantity being αq and the line charge quantity being $2(1-\alpha)q/\kappa h$.

The resulting expression for the potential becomes $$\Phi(\rho, z) = \frac{2(1-\alpha)q}{4\pi\varepsilon_0\kappa h}\frac{z}{\kappa h}\left(\ln\left(\frac{1+\tau}{1-\tau}\right) - 2\tau\right) + \frac{\alpha q}{4\pi\varepsilon_0 R_t} - \frac{\alpha q}{4\pi\varepsilon_0 R_b}. \quad (33)$$

Eq. 33 can be evaluated at ρ=0 and z=h, resulting in $$\Phi(0, h) = \frac{2(1-\alpha)q}{4\pi\varepsilon_0\kappa^2 h}\left(\ln\left(\frac{1+\kappa}{1-\kappa}\right) - 2\kappa\right) + \frac{2\alpha\kappa q}{4\pi\varepsilon_0 h(1-\kappa^2)}. \quad (34)$$

The capacitance becomes $$C(\kappa, \alpha, h) = \frac{4\pi\varepsilon_0 \kappa^2 h}{2(1-\alpha)\left(\ln\left(\frac{1+\kappa}{1-\kappa}\right) - 2\kappa\right) + \frac{2\alpha\kappa^3}{(1-\kappa^2)}}. \quad (35)$$

The effective height is $$h_{\text{eff}} = (1-\alpha)2\kappa h/3 + \alpha\kappa h. \quad (36)$$

The radiation resistance is $$R_r = 40[\kappa h_{\text{eff}} k(2/3+\alpha/3)]^2. \quad (37)$$

The Q becomes $$Q(\alpha, \kappa, h) = \frac{27}{4(2+\alpha)^2\kappa^4(kh)^3}\left[2(1-\alpha)\left(\ln\left(\frac{1+\kappa}{1-\kappa}\right) - 2\kappa\right) + \frac{2\alpha\kappa^3}{(1-\kappa^2)}\right]. \quad (38)$$

Using similar procedures as applied to the previous examples, the minimum value of Q can be found by numerically evaluating Eq. 38 for varying α, κ values at 50 MHz. Table 2 below details the resulting evaluation.

TABLE 2

| α | κ | MinimumQ | R | C |
|---|---|---|---|---|
| 0.5 | 0.611 | 30.39 | 2.84 | 36.8 pF |
| 0.6 | 0.602 | 29.85 | 2.99 | 35.9 pF |
| 0.7 | 0.595 | 29.07 | 3.15 | 34.8 pF |
| 0.8 | 0.588 | 28.42 | 3.30 | 33.9 pF |
| 0.9 | 0.582 | 27.78 | 3.47 | 33.0 pF |
| 0.99 | 0.578 | 27.21 | 3.63 | 32.1 pF |

For large values of α, the addition of a $P_1$ distribution does little to change the performance of the antenna, as compared to the previously modeled antenna. For the case of α=0.9, this antenna's parameters are $$Q = \frac{3.988}{(kh)^3}$$

$$h_e = 0.5626h$$

-continued $$R_r = 12.66 * (kh)^2$$

$$C = 6.7 * 10^{-11} h.$$

Figure 9:
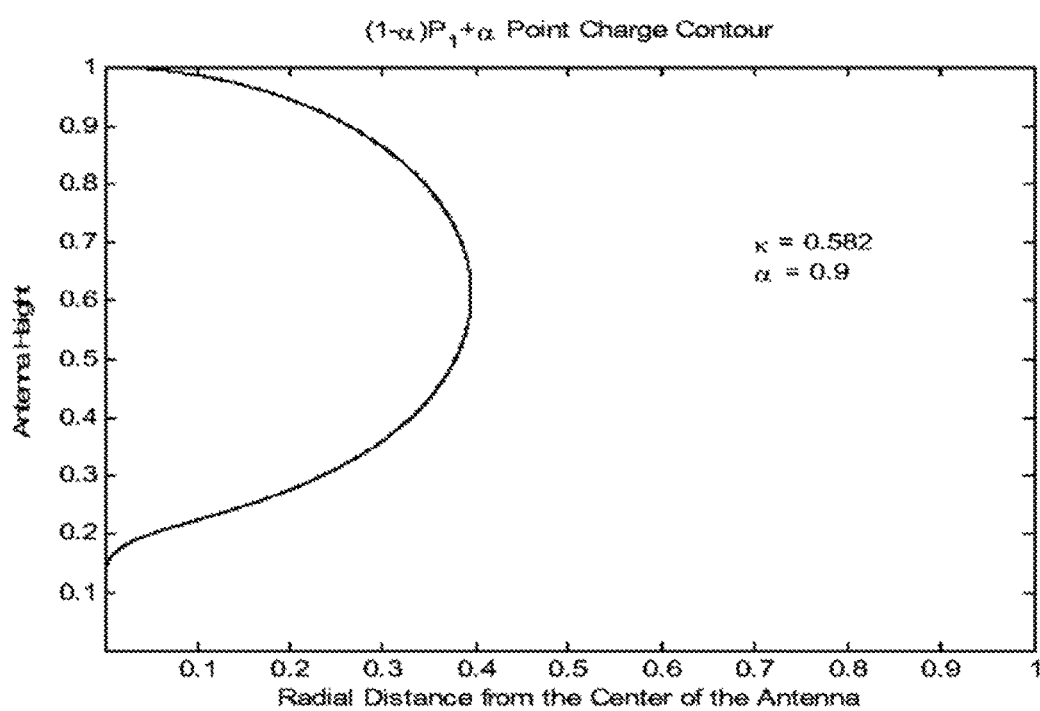
FIG. 9 is an illustration of the contour of an exemplary $(1-\alpha) P_0+\alpha$ point charge antenna, according to an embodiment of this invention.

By using a $P_1$ distribution rather than a constant distribution, only a slight improvement is demonstrated over the $P_0$ distribution for modest values of $\alpha$. For large values of $\alpha$, the values will converge in the limit. FIG. 9 is an illustration of the contour of this exemplary $(1-\alpha)P_1+\alpha$ point charge antenna.

$P_1$ and $P_3$ Legendre Polynomial Charge Distribution

It should be understood that Q is defined by the stored energy in the near field and far fields of the antenna. Part of the stored energy is in the higher order moments of these fields. These moments could be reduced by adding a higher order charge distribution to account for these higher order field moments. In the following exemplary antenna, a higher order charge distribution term, Legendre polynomial $P_3$, is added to the charge distribution. It should be noted that other polynomials or basis functions (not being Legendre in form) may be used without departing from the spirit and scope of this invention.

It should be understood that for the fields created by differing basis functions, for example, Legendre polynomials $-P_1, P_2, P_3, \ldots, P_n$, the respective line charge distributions operate with independent degrees of freedom with different angular and radial dependence. If using Legendre polynomials, the radial and angular dependence can be shown to be $P_n(\theta)/r^{n+1}$ (where $\theta$ is measured from the z axis) for $P_n$. Mathematically, a surface constructed from a sequence of multipole functions should quickly converge.

In the following example, the Legendre polynomial $P_3$ with a coefficient $\alpha_3$ ($\alpha_3 P_3$) is added to a $P_1$ linear charge distribution. The Q can be further reduced by adding a $\alpha_5 P_5$ term. This shifts the $\alpha_3$ value some but reduces the error term to $P_7(\theta)/r^7$. An alternate approach is to algebraically calculate the multipole distribution (on the z axis) for each $P_{2m+1}$ polynomial and solve the equation for the coefficients $\alpha_3$ and $\alpha_5$ to eliminate the $P_3(\theta)/r^4$ and $P_5(\theta)/r^6$ terms in the multipole expansion. In addition, since the shape of the feed point is determined by the line charge distribution, combinations of $P_1, P_3, P_5$, etc. can be used to parameterize the shape of the feed point and the input impedance for high frequencies.

Based on the above observations, the static potential charge distribution on the z axis from z=-L/2 to z=L/2 is $$\Psi_3(\rho, z) = \int_{-L/2}^{L/2} \frac{P_3(2x/L)}{\sqrt{(x-z)^2 + \rho^2}} = \tag{39}$$

$$\frac{20}{L^3}\left[\frac{5}{12}Lz(R_1+R_2) - 2z\tau\left(\frac{11}{6}z^2 + \frac{L^2}{12} - \frac{2}{3}\rho^3\right) + \right.$$

$$\left. z\left(z^2 - \frac{3}{2}\rho^2\right)\ln\left(\frac{1+\tau}{1-\tau}\right)\right] - \frac{3z}{L}\left(\ln\left(\frac{1+\tau}{1-\tau}\right) - 2\tau\right),$$

(Note: the above three lines are one equation)
where $$\tau = \frac{L}{R_1 + R_2},$$

L is the length, $R_1 = \sqrt{(z-L/2)^2 + \rho^2}$ and $R_2 = \sqrt{(z+L/2)^2 + \rho^2}$. If h is the height of the antenna, the line charge must be less than this height by a factor $\kappa < 1$.

Eq. 40 represents both the monopole and image: $L=2\kappa h$. The potential $\Phi$ can be re-expressed in terms of fields ($\Psi_1$ and $\Psi_3$) generated from the Legendre polynomials, the expression being $$\Phi(\rho, z) = \frac{2q}{\kappa h}[\Psi_1(\rho, z) + \alpha\Psi_3(\rho, z)], \tag{40}$$

where $\alpha$ is a coefficient for the contribution of the $\Psi_3$ term.

It should be noted that Eq. 40 can have a negative charge distribution. If the charge distribution is negative near the base of the antenna, the feed point is above ground level. If the charge distribution is negative near the top of the antenna, the feed point is at the base. In latter case, the negative charge distribution must be enclosed by the equal potential surface. If the equipotential surface cuts across the charge distributions the solution is understood to not be a valid solution (the feed point is the only exception).

Following procedures previously discussed, the total charge q on the monopole is $$q_{Net} = \frac{2q}{\kappa h}\int_0^{\kappa h}[P_1(z/\kappa h)dz + \alpha P_3(z/\kappa h)dz]. \tag{41}$$

Using a substitution of variables by letting $u=z/\kappa h$, the charge distribution as a function of the Legendre polynomials can be cast as $$q_{Net} = \frac{2q}{\kappa h}\kappa h\left[\int_0^1 P_1(u)du + \alpha\int_0^1 P_3(u)du\right]. \tag{42}$$

Substituting the functions $P_1(u)$ and $P_3(u)$, and simplifying yields $$q_{Net} = q\left(1 - \frac{\alpha}{4}\right). \tag{43}$$

For $\alpha \leq \frac{2}{3}$, the feed point is at the ground and the total charge above the feed point is $q_{Net}$. For $\alpha > \frac{2}{3}$, the feed point is at $$z = \sqrt{\frac{3\alpha - 2}{5\alpha}}$$

and the total charge above the feed point is $$q_{fp} = q\left[\left(1 - \frac{\alpha}{4}\right) + \frac{(3\alpha - 2)^2}{20\alpha}\right].$$

The radiation resistance then given by $$R_r = 40\left(\frac{2\kappa hk}{3\left(1-\frac{\alpha}{4}\right)}\right)^2 \text{ for } \alpha \leq 2/3 \quad (45)$$

$$R_r = 40\left(\frac{2\kappa hk}{3\left[\left(1-\frac{\alpha}{4}\right)+\frac{(3\alpha-2)^2}{20\alpha}\right]}\right)^2 \text{ for } \alpha \leq 2/3.$$

If $\alpha<-1$, the combination of $P_3$ and $P_3$ creates a negative charge distribution at the end of the wire. The negative charge distribution could cause the equipotential surface to cut cross the charge distributions which, as mentioned above, would generate an invalid solution. Therefore, the potential must be calculated near the end of the charge distribution to verify that the charge distribution is enclosed within the equipotential surface. This is demonstrated as $$\Psi_3(0,z) = \frac{5}{2}\left(\frac{2}{L}\right)^3\left[\frac{5}{6}Lz^2 - z\left(\frac{L}{2}\right)\left(\frac{11}{6}z^2 + \frac{L^2}{12}\right) + z^3\ln\left(\frac{1+L/2z}{1-L/2z}\right)\right] - \frac{3}{2}\left[\frac{2z}{L}\left(\ln\left(\frac{1+L/2z}{1-L/2z}\right) - 2\frac{L}{2z}\right)\right]. \quad (46a)$$

Substituting $L=2\kappa h$ recasts Eq. 46a as $$\Psi_3(0,z) = \quad (46b)$$
$$\frac{5}{2}\left(\frac{1}{\kappa h}\right)^3\left[\frac{5}{3}\kappa h z^2 - 2z\left(\frac{\kappa h}{z}\right)\left(\frac{11}{6}z^2 + \frac{(\kappa h)^2}{3}\right) + z^3\ln\left(\frac{z+\kappa h}{z-\kappa h}\right)\right] - \frac{3}{2}\left[\frac{z}{\kappa h}\left(\ln\left(\frac{z+\kappa h}{z-\kappa h}\right) - 2\frac{\kappa h}{z}\right)\right].$$

Now with $$\Phi_{max} = \frac{2q}{\kappa h}(\Psi_1 + \alpha\Psi_3)$$

on the interval $\kappa h<z\leq 1$, this value must be larger than a calculated $\Phi_{max}$ on the surface of an enclosing sphere. In this situation, the equation for the capacitance and Q on the sphere cannot be written and, therefore, the problem must be numerically solved.

Figure 10:
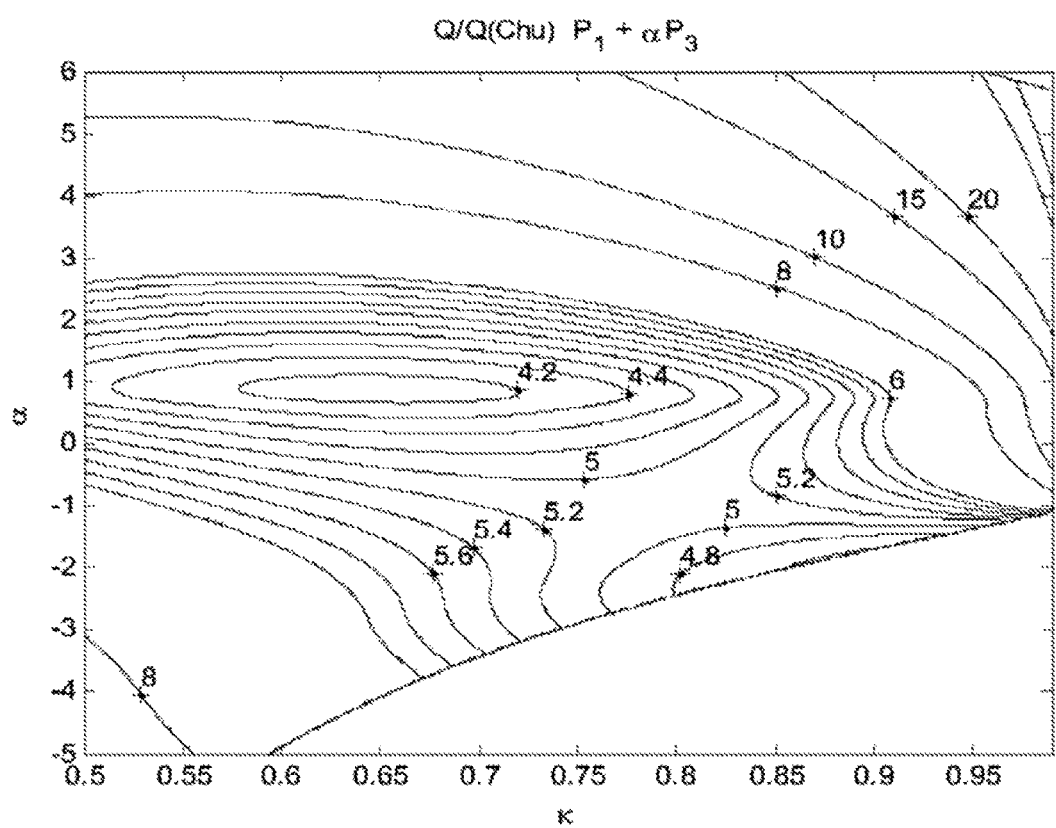
FIG. 10 is a graph of the $Q/Q_{Chu}$ ratio as a function of $\alpha$ and $\kappa$, for an exemplary $P_1+\alpha P_3$ charge antenna, according to an embodiment of this invention.

FIG. 10 is a plot of the $Q/Q_{Chu}$ ratio as a function of the parameters $\kappa$ and $\alpha$. The upper boundary, in the right hand corner of FIG. 10, is caused by the potential becoming negative on the enclosing sphere which means the antenna is not inside the enclosing sphere. The lower boundary, in FIG. 10, is caused by the potential surface crossing the charge distribution at the top.

Figure 11:
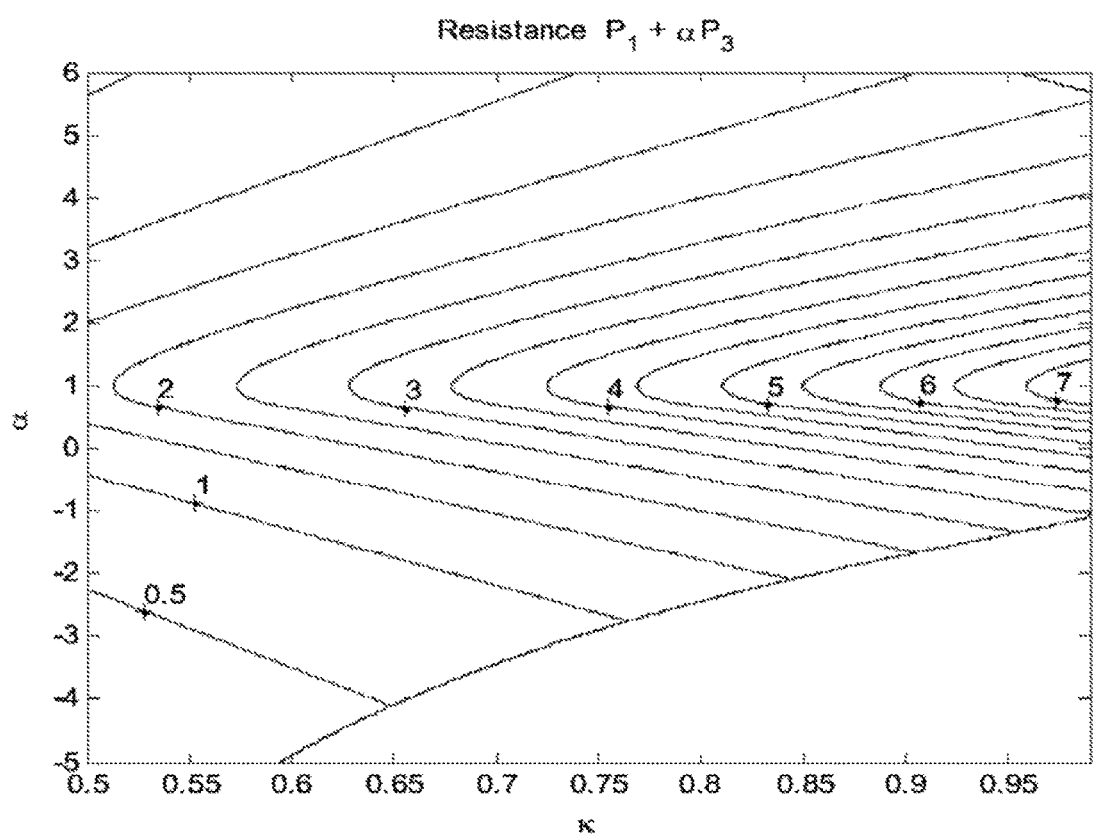
FIG. 11 is a graph of the resistance as a function of $\alpha$ and $\kappa$, for an exemplary $P_1+\alpha P_3$ charge antenna, according to an embodiment of this invention.
Figure 12:
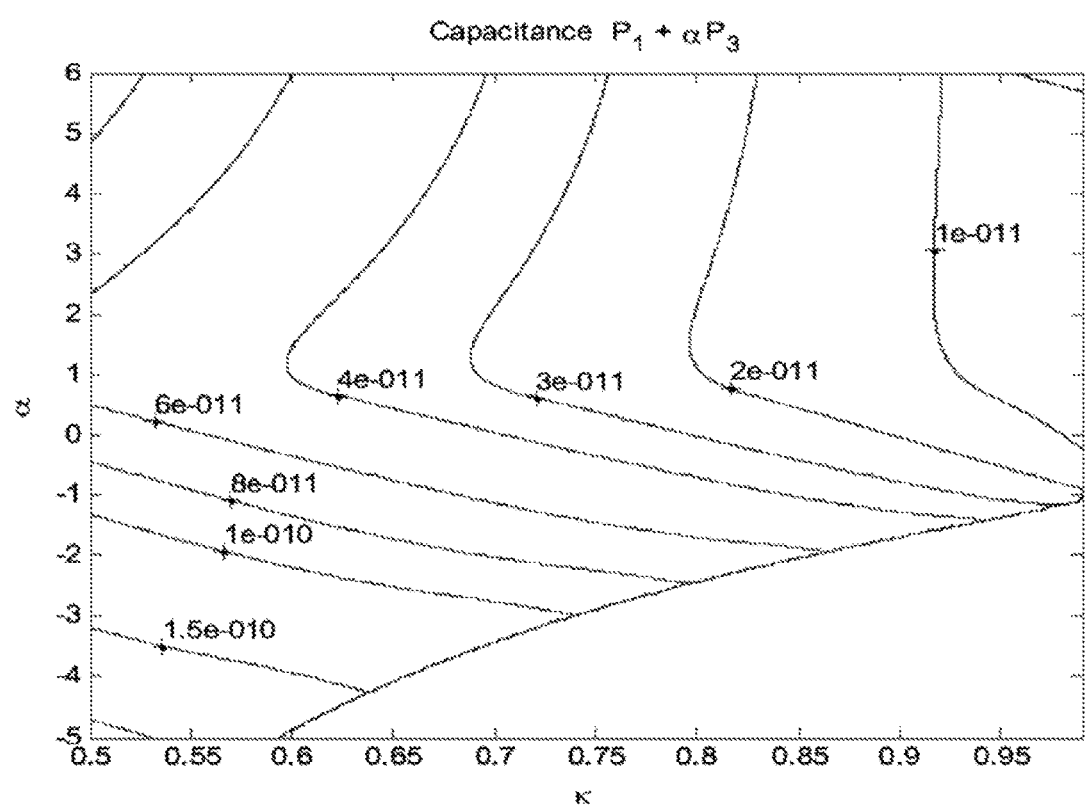
FIG. 12 is a graph of the capacitance as a function of $\alpha$ and $\kappa$, for an exemplary $P_1+\alpha P_3$ charge antenna, according to an embodiment of this invention.

When $\alpha=0$, the Eq. 46b reduces to the previous solution for the sole $P_1$ charge distribution antenna, as is expected. At 50 MHz and $h=\frac{1}{2}$, the solution to Eq. 46b has two minimums: an absolute minimum at Q=28.706 corresponding to $Q/Q_{Chu}=4.1207$ at $\kappa=0.6513$ and $\alpha=0.8600$, with R=3.1939 and C=34.718 pF; and a local minimum at Q=31.879 corresponding to $Q/Q_{Chu}=4.576$ at $\kappa=0.88$, $\alpha=-1.835$, with R=1.7737 and C=56.294 pF. These tabulations are shown in FIGS. 11-12. FIG. 11 is a plot of the resistance as a function of $\alpha$ and $\kappa$, for an exemplary $P_1+\alpha P_3$ charge antenna. And FIG. 12 is a plot of the capacitance as a function of $\alpha$ and $\kappa$, for an exemplary $P_1+\alpha P_3$ charge antenna. As can be seen from these FIGS., various Q solutions can be found.

Figure 13:
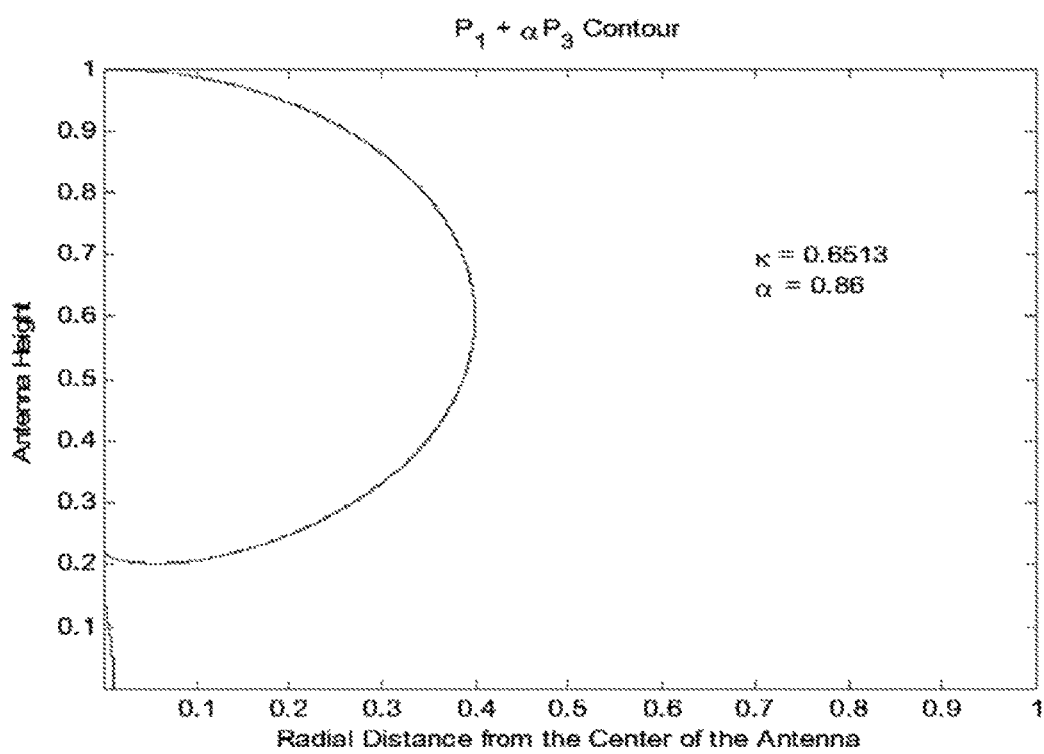
FIG. 13 is an illustration of the contour of an exemplary $P_1+\alpha P_3$ charge antenna, according to an embodiment of this invention.

FIG. 13 is an illustration of the contour of an exemplary $P_1+\alpha P_3$ charge antenna for a global minimum Q of 28.706, using an a value of 0.8600 and a $\kappa$ value of 0.6513. This exemplary $P_1+\alpha P_3$ charge antenna is shaped similar to a volcano and smoke antenna and has a Q of 4.1027 times Chu's theoretical result. The antenna parameters for this design are:

$$Q = \frac{4.1207}{(kh)^3}$$

$$h_e = .53967h$$

$$R_r = 11.65(kh)^2$$

$$C = 6.943 \ast 10^{-11}h$$

The radiation resistance for this antenna is 35% higher than the single $P_1$ charge distribution antenna and Q is 12% lower. This is offset by 15% decrease in the capacitance of the antenna.

Figure 14:
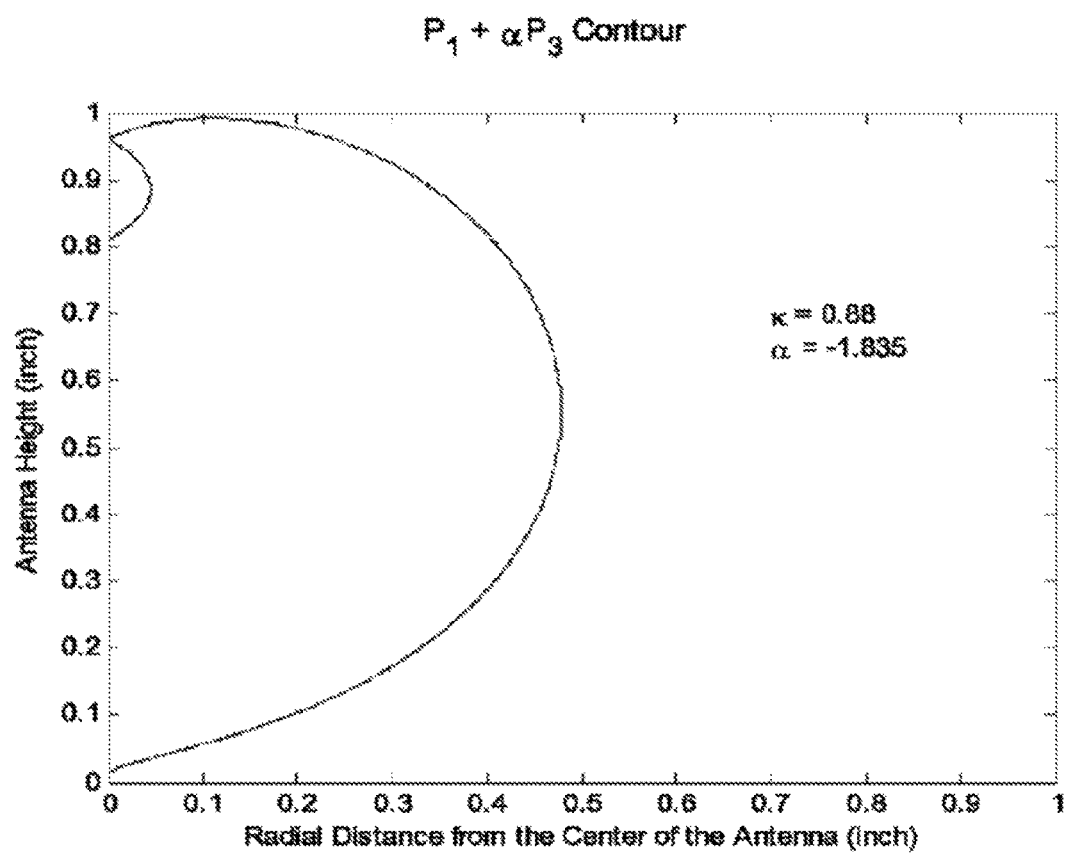
FIG. 14 is an illustration of the contour of an exemplary $P_1+\alpha P_3$ charge antenna, having the local minimum Q solution for $\alpha=-1.835$ and $\kappa=0.88$, according to an embodiment of this invention.

Of some interest is the shape of the local minimum Q solution. FIG. 14 illustrates the cross-sectional view of the local minimum solution Q=31.879 for an a value of −1.835 and a $\kappa$ value of 0.88. It is worthy to note, for this exemplary $P_1+\alpha P_3$ charge antenna, the mathematical artifact of having a negative charge is seen in the closed cavity at the top of FIG. 14.

$P_0$ with Oblate Spheroid

From the above examples, it is apparent that the point charge at the end of constant line charge ($P_0$) antenna reduces the Q of the antenna. This point charge is equivalent to giving a spherical topload to the $P_0$ charge distribution. However, in the above configurations, the top of the spherical volume was not filled by the antenna. If the spherical volume is filled by the antenna, then this will reduce the charge surface density, which is known to increase the capacitance, which would decrease Q.

However, a better choice for the topload would be an oblate spheroid. The eccentricity can be continuously varied from 0, a sphere, to 1, a disk. It should be noted that this antenna is not the same as a disk loaded monopole, which is well known in the antenna community. In the disk loaded monopole the charge is on the bottom of the disk with minimal charge on the top surface. For the oblate spheroid loaded $P_0$ charge antenna, the oblate spheroid has equal charge on both upper and lower surfaces. When the image is added, the effective charge density on the top surface will be reduced and the effective charge density on the bottom surface will be increased.

The potential for an oblate spheroid with a charge q is derived with oblate spheroidal coordinates. The cylindrical coordinates can be expressed as oblate spheroid coordinates as:

$$z = a \sin h\, u \sin v$$

$$\rho = a \cos h\, u \cos v. \quad (47)$$

(Note: a parameterizes the eccentricity variable in the oblate spheroidal domain and $\alpha$ is the charge proportionality variable.) The potential can be expressed as a function of u only:

$$\Phi(u) = \frac{q}{4\pi\varepsilon_0 a}\left(\frac{\pi}{2} - \arctan(\sinh u)\right). \tag{48}$$

Using procedures similar to those discussed above, the potential field generated from a constant line charge terminated with an oblate spheroidal point charge is $$\Phi = \frac{(1-\alpha)q}{4\pi\varepsilon_0 \kappa h}\ln\left(\frac{(1+\tau_m)(1-\tau_i)}{(1-\tau_m)(1+\tau_i)}\right) + \frac{\alpha q}{4\pi\varepsilon_0 a}[\arctan(\sinh u_b) - \arctan(\sinh u_t)], \tag{49}$$

where the parameter a plays a role indirectly via u, and $u_t$ is for the top of the spheroid and $u_b$ is for the bottom of the spheroid in the spheroidal coordinate system.

Figure 15:
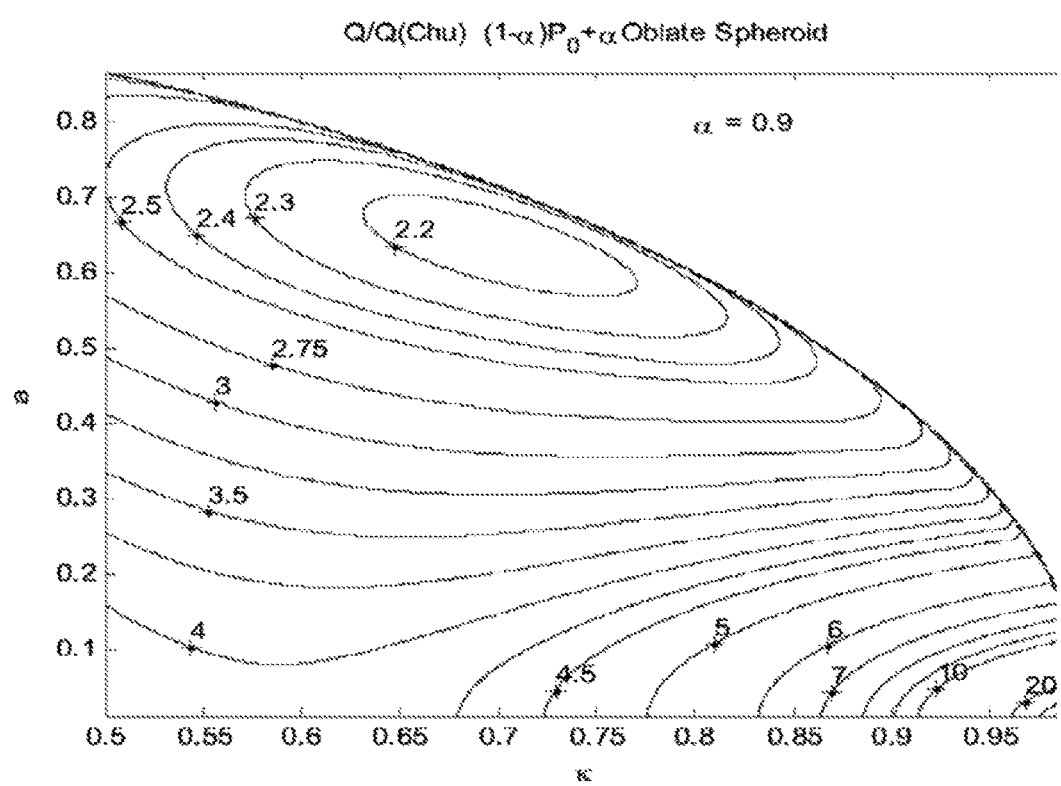
FIG. 15 is a graph of the $Q/Q_{Chu}$ ratio as a function of $\alpha$ and $\kappa$, for $\alpha=0.9$, for an exemplary $(1-\alpha)P_0+\alpha$ oblate spheroid charge antenna, according to an embodiment of this invention.

The maximum potential is not at the top of the oblate spheroid, thus Eq. 49 is numerically evaluated on the surface of the enclosing sphere of the antenna. FIG. 15 illustrates a graph of the values of $Q/Q_{Chu}$ as a function of $\alpha$ and $\kappa$, where $\alpha=0.9$. For varying values of a, a unique solution can be found for Eq. 49. Each of these solutions can be optimized to result in a $\kappa$ and $\alpha$ value at 50 MHz. A tabulation of these values is shown in Table 3 below.

TABLE 3

| α | κ | a | Minimum Q | R | C |
|---|---|---|---|---|---|
| 0.5 | 0.691 | 0.722 | 19.421 | 2.94 | 55.7 pF |
| 0.6 | 0.6985 | 0.703 | 17.455 | 3.42 | 53.3 pF |
| 0.65 | 0.707 | 0.6905 | 16.786 | 3.73 | 50.9 pF |
| 0.675 | 0.706 | 0.671 | 16.523 | 3.83 | 50.3 pF |
| 0.7 | 0.709 | 0.6575 | 16.305 | 3.98 | 49.0 pF |
| 0.725 | 0.709 | 0.649 | 16.129 | 4.10 | 48.2 pF |
| 0.75 | 0.709 | 0.647 | 15.962 | 4.22 | 47.2 pF |
| 0.8 | 0.707 | 0.643 | 15.636 | 4.44 | 45.8 pF |
| 0.9 | 0.705 | 0.637 | 15.008 | 4.91 | 43.16 pF |
| 0.99 | 0.702 | 0.633 | 14.475 | 5.35 | 41.1 pF |

For the case of 90% of the charge on the surface of the oblate spheroid, the antenna parameters are:

$$Q = \frac{2.1544}{(kh)^3}$$

$$h_e = 0.670h$$

$$R_r = 17.9 * (kh)^2$$

$$C = 8.632 * 10^{-11} h$$

Figure 16:
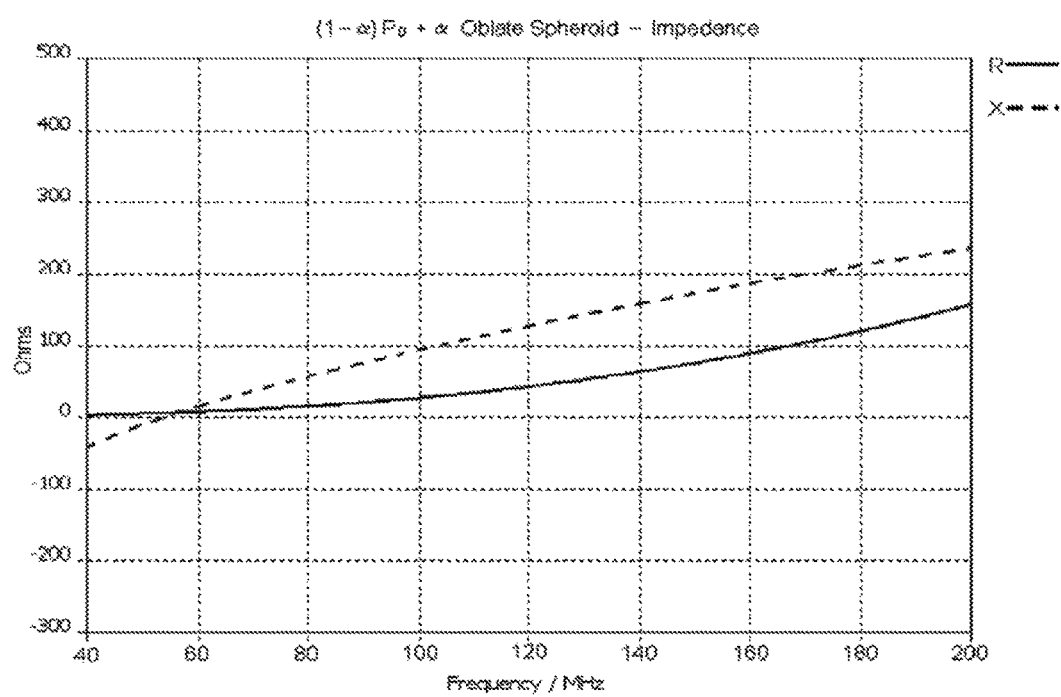
FIG. 16 is a graph of the impedance and resistance for an exemplary $(1-\alpha)P_0+\alpha$ oblate spheroid charge antenna, according to an embodiment of this invention.
Figure 17:
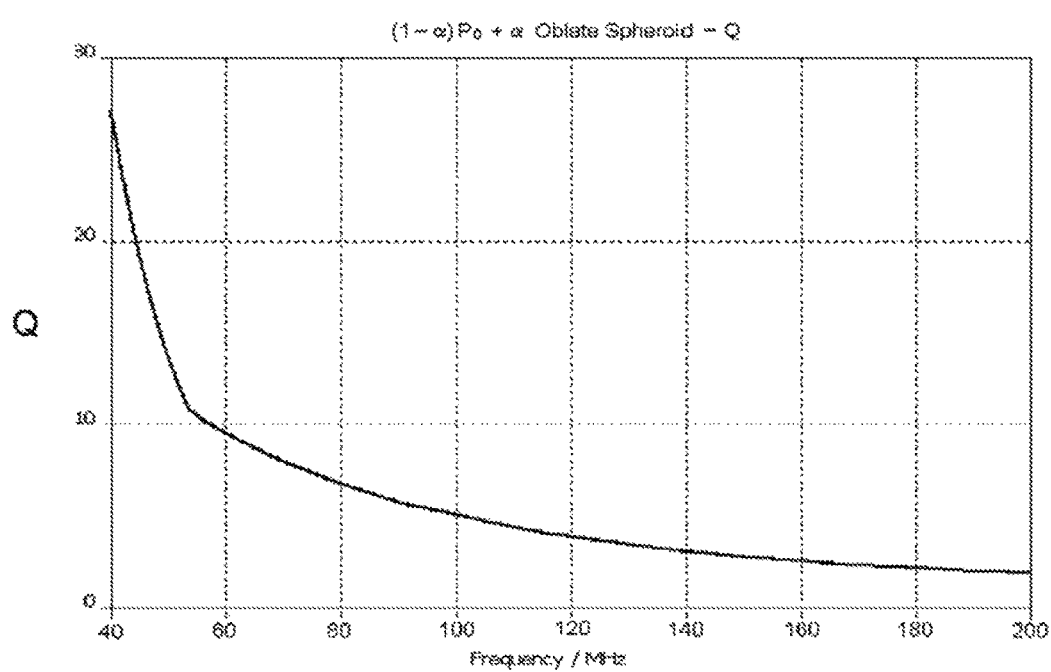
FIG. 17 is a graph of the Q behavior, for an exemplary $(1-\alpha)P_0+\alpha$ oblate spheroid charge antenna, according to an embodiment of this invention.

The resulting Q is found to be almost half of the result for the "bulb" antenna, which utilized a constant line charge with a point charge termination (i.e., spherical topload). The Q is 47% lower; R and C are 46% and 30% higher, respectively, than the bulb antenna. This exemplary $(1-\alpha)/P_0+\alpha$ oblate spheroid charge antenna was numerical modeled using $\alpha=0.90$. The exemplary numerical model was generated using a cylindrical antenna with a continuous surface and with a ½ half meter height. FIG. 16 is a graph of the impedance and resistance of the modeled antenna, as a function of frequency. FIG. 17 is a graph of the Q behavior, as a function of the frequency.

Figure 18:
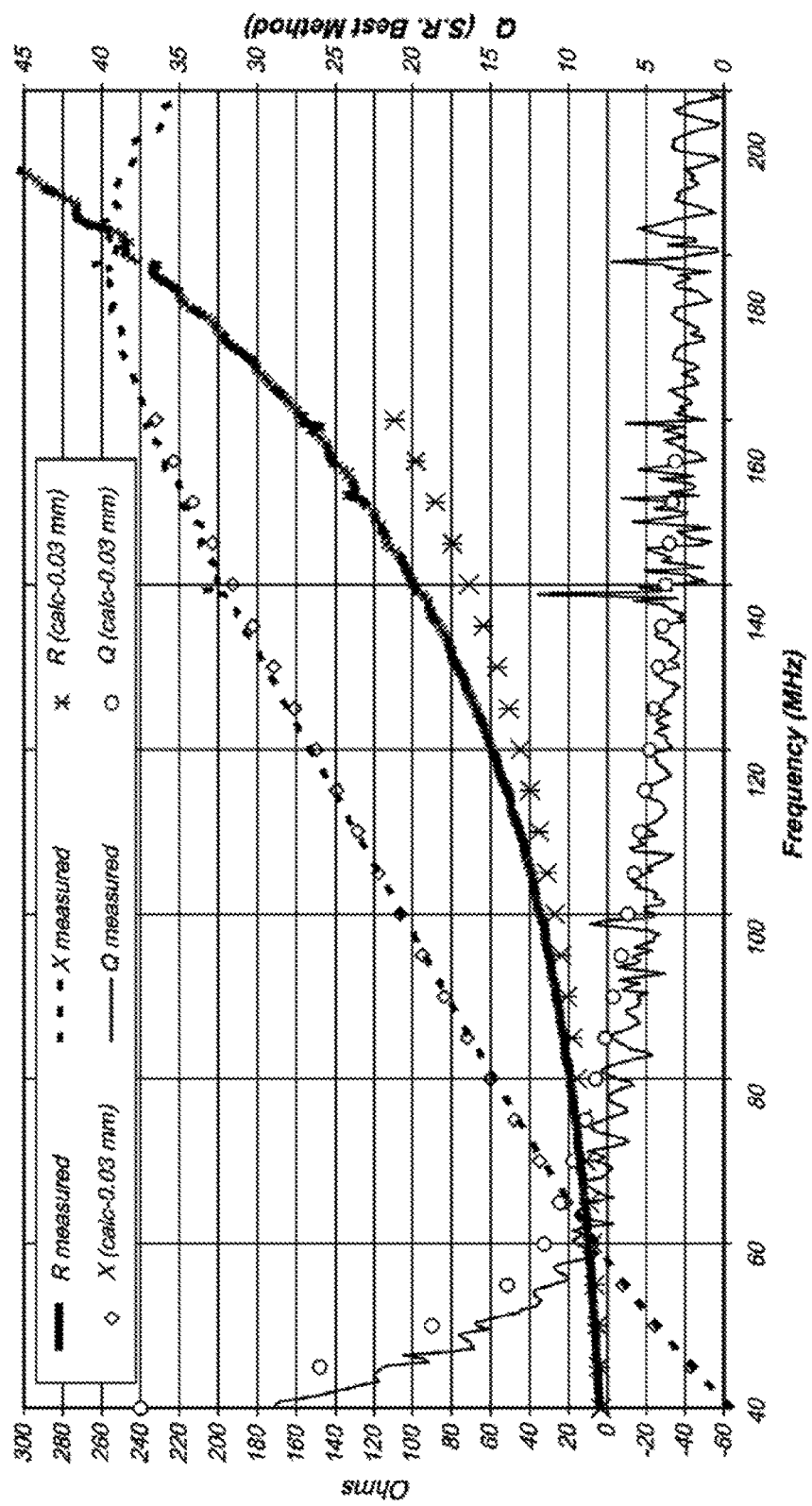
FIG. 18 is graph comparing measurements of an exemplary $(1-\alpha)P_0+\alpha$ oblate spheroid charge antenna, to numerically derived values, according to an embodiment of this invention.
Figure 19:
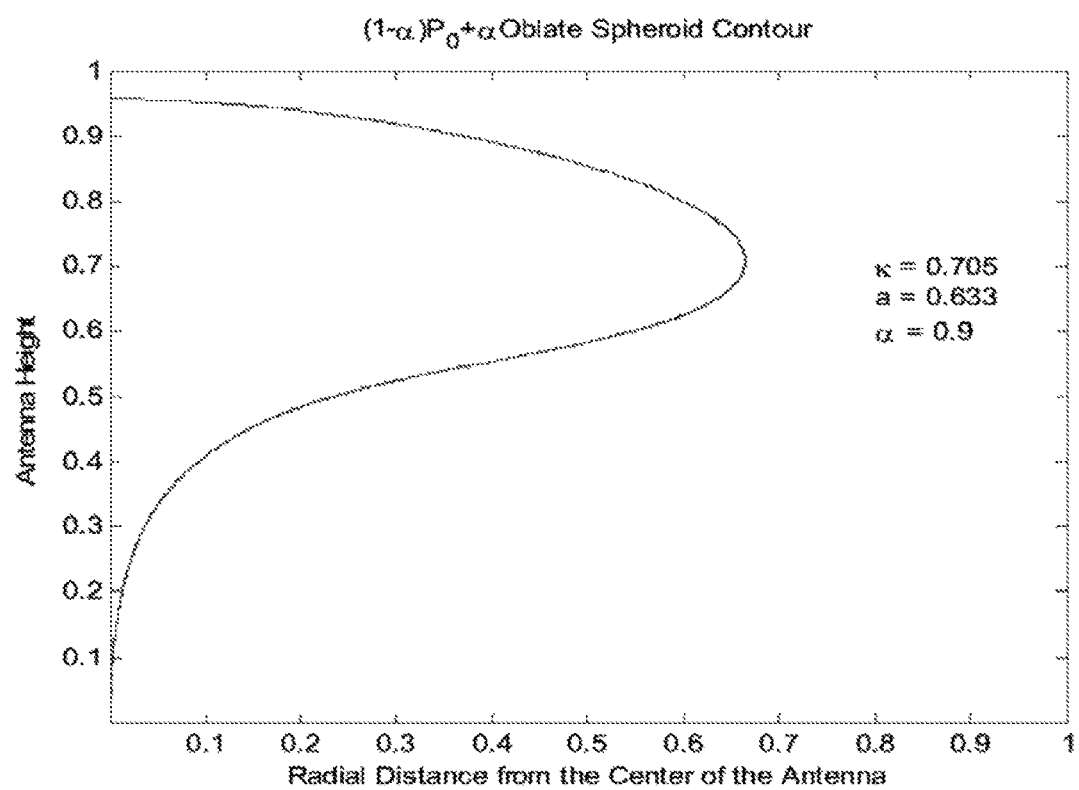
FIG. 19 is an illustration of the contour of an exemplary $(1-\alpha)P_0+\alpha$ oblate spheroid charge antenna, according to an embodiment of this invention.

Based on the results of these numerical models, an exemplary ½ meter antenna was physically built using 16 wires to approximate a solid surface. The exemplary antenna was evaluated over a frequency range from 40 MHz to over 200 MHz. The measurement results of the antenna demonstrated a very low Q and well behaved impedance profile. FIG. 18 is a plot of the comparison of the exemplary experimental model to the exemplary numerical models. FIG. 19 is an illustration of the contour for an exemplary $(1-\alpha)P_0+\alpha$ oblate spheroid charge antenna.

$P_1$ with Oblate Spheroid

The same above exemplary technique can be expanded upon using a $P_1$ line charge instead of a $P_0$ line charge, with an oblate spheroid end charge. Using the $P_1$ line charge, the expression for the maximum potential field becomes $$\Phi_{max}(sphere) = \frac{2(1-\alpha)qz}{4\pi\varepsilon_0(\kappa h)^2}\left(\ln\left(\frac{1+\tau}{1-\tau}\right) - 2\tau\right) + \frac{\alpha q}{4\pi\varepsilon_0 a}[\arctan(\sinh u_b) - \arctan(\sinh u_t)]. \tag{50}$$

The results of this procedure is shown in Table 4 below.

TABLE 4

| α | κ | a | Minimum Q | R | C |
|---|---|---|---|---|---|
| 0.5 | 0.6777 | 0.7217 | 18.95 | 3.50 | 48.0 pF |
| 0.6 | 0.6720 | 0.7270 | 17.14 | 3.72 | 49.9 pF |
| 0.61 | 0.6767 | 0.7362 | 16.80 | 3.80 | 49.86 pF |
| 0.62 | 0.6772 | 0.7349 | 16.64 | 3.84 | 49.87 pF |
| 0.7 | 0.7000 | 0.7000 | 15.60 | 4.35 | 46.9 pF |
| 0.8 | 0.7049 | 0.6516 | 14.95 | 4.75 | 44.9 pF |
| 0.9 | 0.7026 | 0.6394 | 14.69 | 5.06 | 42.8 pF |
| 0.99 | 0.6990 | 0.636 | 14.45 | 5.32 | 41.4 pF |

Using a 90% charge on the oblate spheroid, the antenna parameters become:

$$Q = \frac{2.109}{(kh)^3}$$

$$h_e = 0.6792h$$

$$R_r = 18.46 * (kh)^2$$

$$C = 9.192 * 10^{-11} h.$$

Figure 20:
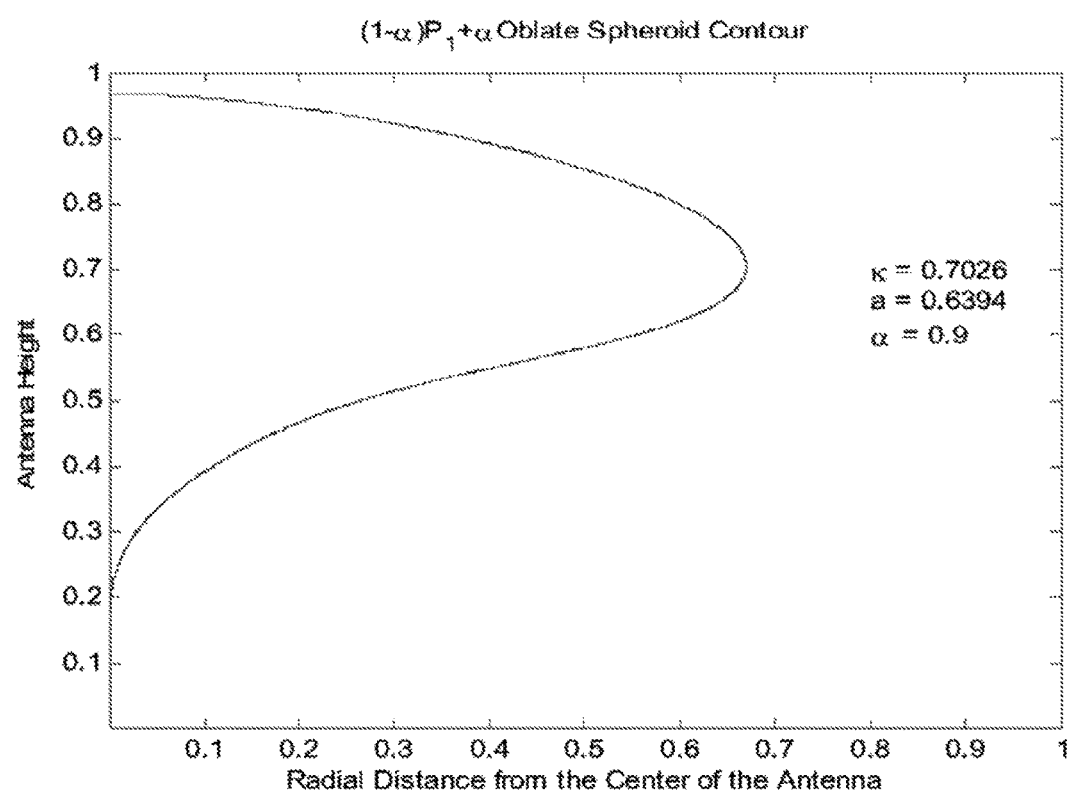
FIG. 20 is an illustration of the contour of an exemplary $(1-\alpha)P_1+\alpha$ oblate spheroid charge antenna, according to an embodiment of this invention.

For h=½ m and 50 MHz, with $\alpha=0.9$, the minimum, Q=14.69 which is 2.109 times Chu's theoretical result. FIG. 20 illustrates a cross-sectional view of an exemplary $(1-\alpha) P_1+\alpha$ oblate spheroid charge antenna, using the parameters designed above.

$P_0$ with Oblate Spheroid and $2^{nd}$ Harmonic on Oblate Spheroid

The oblate spheroid solution can be further improved by redistributing the charge to modify the potential curves and therefore the shape of the surface. This can be calculated by solving the scalar potential equations for the oblate coordinate system. The scalar potential equation in this coordinate system can be expressed as $$\Phi(u, v) = \sum_{n=0}^{\infty} a_n K_n(iu) P_n(v), \tag{51}$$

where $P_n$ are Legendre polynomials, $i=\sqrt{-1}$, and the $K_n(iu)$ terms are the far-field dependence functions. Eq. 51 can be tackled using separation of variables in the oblate coordinate system with the solutions for the u dependence obtained from Arfkin's classic text—"Numerical Methods for Physicists," $2^{nd}$ Edition, Academic Press, Ohio, 1970.

Eq. 51 with $K_0$ (iu), $P_0$(v) was used in the oblate spheroidal calculation. The second term $K_1(u)P_1(v)$ is an odd function and would change the shape of the oblate spheroid in a non-symmetric manner so that the assumption about the effective height would not be valid. Therefore, it is not used. The third term $K_2(iu)P_2(v)$ is symmetric which makes it suitable for our purposes. In Eq. 51, these first and third terms will be used to modify the oblate spheroid's shape. For reference, the first few values of K are $K_0(u)=i$ arccot$(u)$ $K_1(u)=u$ arccot$(u)-1$ $K_2(iu)=i½(3u^2+1)$arccot$(u)-i3/2u$ The general form of these terms being $$K_n(iu) = \qquad (52)$$
$$-iP_n(iu)\arccos(u) - \frac{2n-1}{n}P_{n-1}(iu) - \frac{(2n-5)}{3(n-1)}P_{n-3}(iu) -- \ldots,$$

where $P_n$ are Legendre polynomials and the sum terminates at the first singular term.

For simplicity only the $P_0$(v) and $P_2$ (v) polynomials were used as they redistribute the charges equally on both sides of the oblate spheroid. None of the high order $P_n$ (v), n≠0 polynomials change the net charge on the oblate spheroid. Based on this decomposition, the potential field expression becomes $$\Phi_{Ob2} = \frac{(1-\alpha)q}{4\pi\varepsilon_0\kappa h}\ln\left(\frac{(1+\tau_m)(1-\tau_i)}{(1-\tau_m)(1+\tau_i)}\right) + \qquad (53)$$
$$\frac{\alpha q}{4\pi\varepsilon_0 a}[\arctan(\sinh u_b) - \arctan(\sinh u_t)] +$$
$$\frac{\beta q}{4\pi\varepsilon_0 a}\left[\left((3u_t^2+1)\arccot(u_t) - \frac{3}{2}u_t\right)P_2(v_t) - \right.$$
$$\left.\left((3u_b^2+1)\arccot(u_b) + \frac{3}{2}u_b\right)P_2(v_b)\right],$$

The effective height becomes $h_{eff}=(1-\alpha)\kappa h/2+\alpha\kappa h$ and the radiation resistance is $R_r=10[\kappa h k(1+\alpha)]^2$. Using procedures previously described, Q is numerically calculated. It is noted that the addition of the second order term $P_2$ modifies the source charge on the oblate spheroid to where it could be negative at the center of the oblate spheroid or at the edge of the oblate spheroid. A program verified that an equipotential surface encloses all the charge in two areas: at $\rho=0$ on z axis and at edge of the oblate spheroid.

Figure 21:
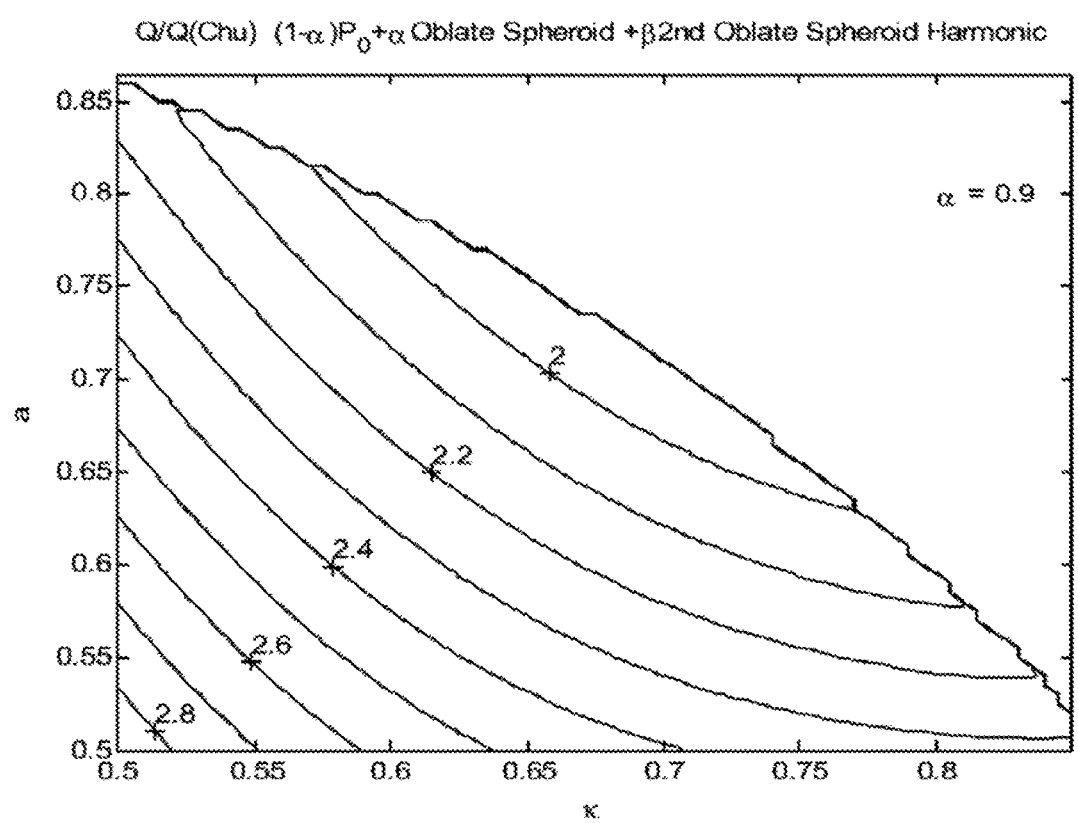
FIG. 21 is a graph of the $Q/Q_{Chu}$ ratio for an exemplary $(1-\alpha)P_0+\alpha$ oblate spheroid+$\beta$ $2^{nd}$ harmonic oblate spheroid charge antenna, according to an embodiment of this invention.

From the above derivations, the $Q/Q_{Chu}$ ratio is a function of κ, α, β, and a is plotted in FIG. 21. The parameter β is calculated to obtain the minimum value of Q. From FIG. 21, the minimum Q is found at κ=0.698, α=0.706, and Q=0.357 for a 90% charge distribution on the oblate spheroid. At 50 MHz, the absolute values of the antenna at this minimum is Q=14.363, R=4.822, and C=45.96 pF. The resulting antenna parameters, as a function of k and h become $$Q = \frac{2.0617}{(kh)^3}$$

-continued $$h_e = 0.6631h$$
$$R_r = 17.588*(kh)^2$$
$$C = 9.192*10^{-11}h.$$

Figure 22:
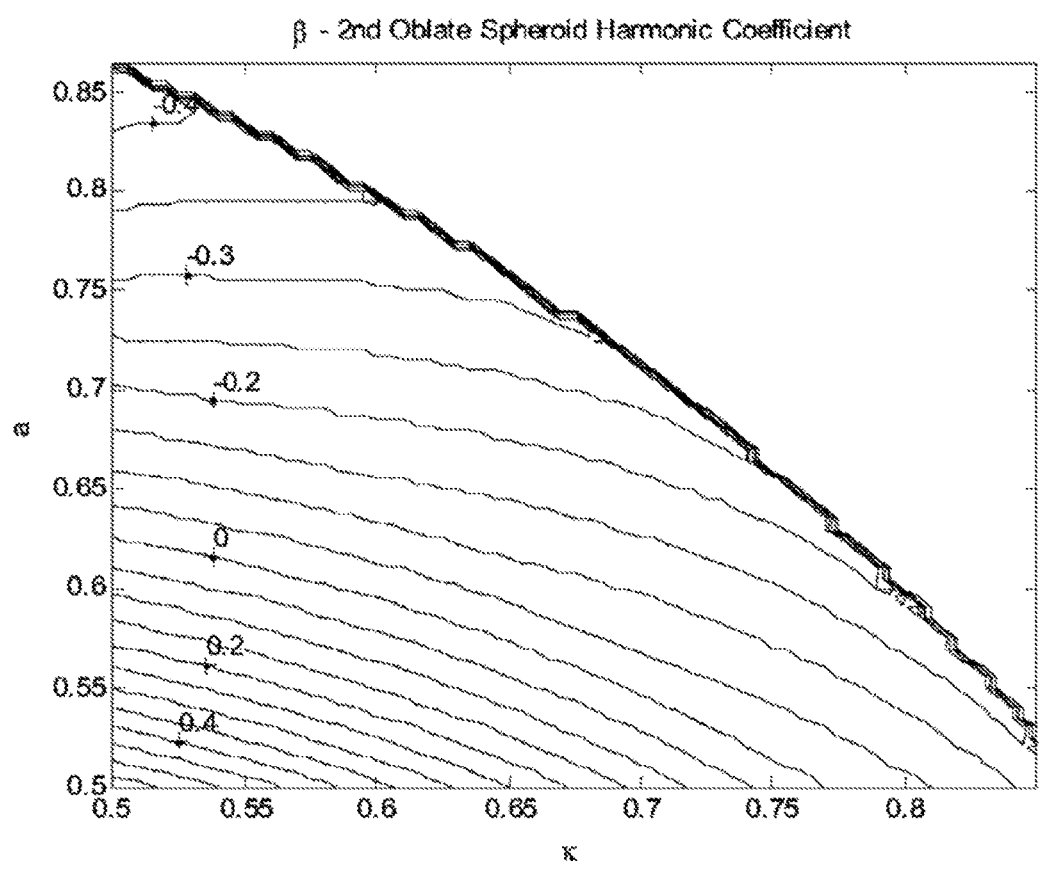
FIG. 22 is a graph of the $\beta$ distribution as a function of $\kappa$ and $\alpha$, for a minimum Q for an exemplary $(1-\alpha)P_0+\alpha$ oblate spheroid+$\beta$ $2^{nd}$ harmonic oblate spheroid charge antenna, according to an embodiment of this invention.
Figure 23:
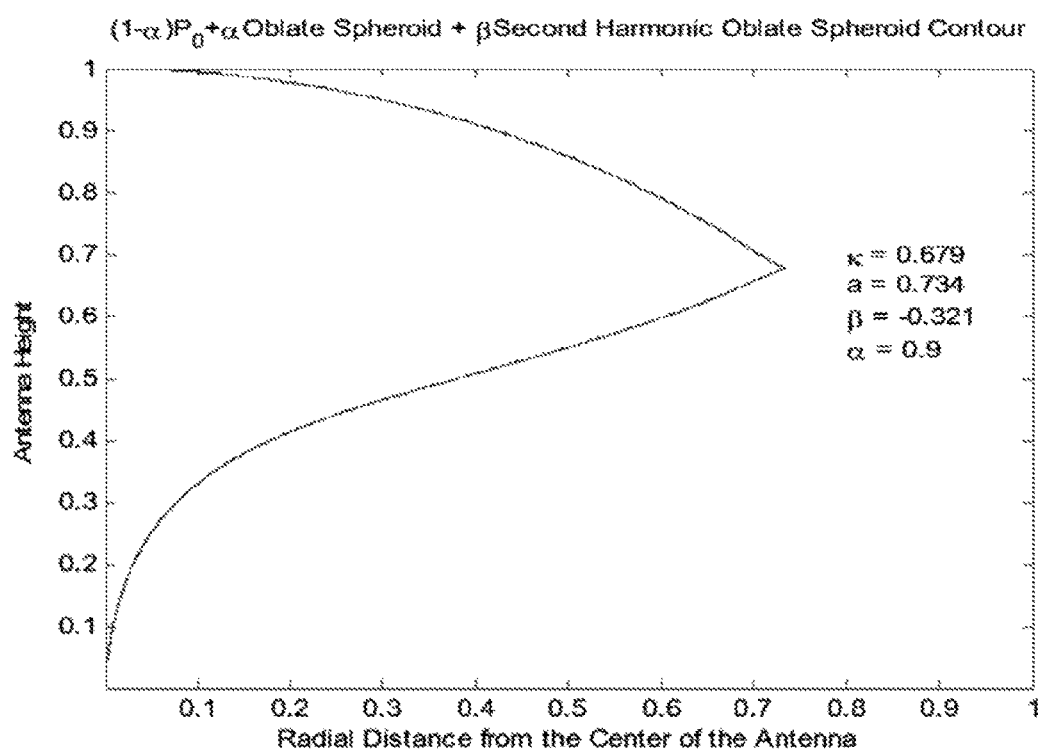
FIG. 23 is an illustration of the contour of an exemplary $(1-\alpha)P_0+\alpha$ oblate spheroid+$\beta$ $2^{nd}$ harmonic oblate spheroid charge antenna, according to an embodiment of this invention.

FIG. 22 is a plot of the β distribution as a function of κ and α for a minimum Q. FIG. 23 demonstrates the cross-sectional shape of the exemplary (1−α) $P_0$+α oblate spheroid+β second harmonic on oblate spheroid charge antenna. It is interesting to note that the shape of this antenna is practically mushroom-like.

Non-Spherical Enclosing Volume

Using the previous example, the exemplary (1−α)$P_0$+α oblate spheroid+β second harmonic on oblate spheroid charge antenna was constrained to fit within an inverted 45° cone where the angle is measured with respect to the vertical. Mathematically, this is expressed as ρ=1−z. The capacitance is calculated from the largest value of the potential on this cone. It should be noted, however, any enclosing surface may be used to arrive at a correct solution, therefore an appropriate solution is not limited to the use of 45° or a cone, but is used here as just one example of many approaches that may be used.

Figure 24:
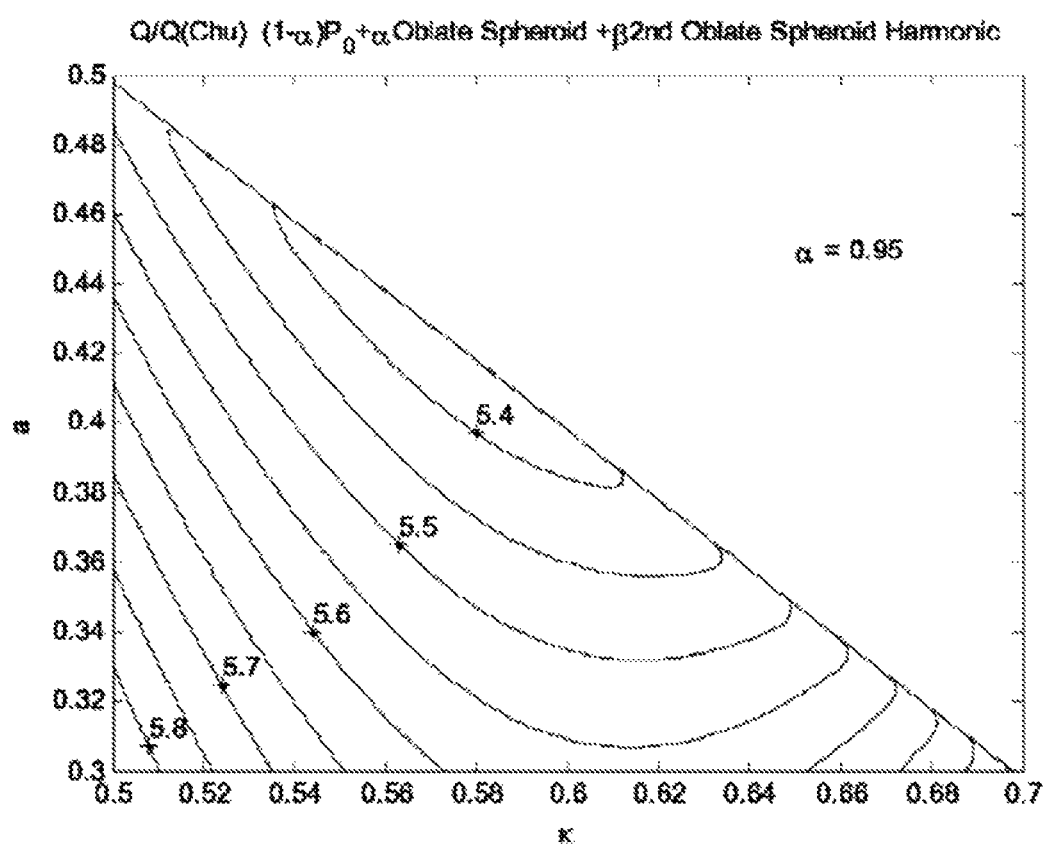
FIG. 24 is a graph of the $Q/Q_{Chu}$ ratio as a function of $\alpha$ and $\kappa$, for an exemplary $(1-\alpha)P_0+\alpha$ oblate spheroid+$\beta$ $2^{nd}$ harmonic oblate spheroid charge antenna, according to an embodiment of this invention.
Figure 25:
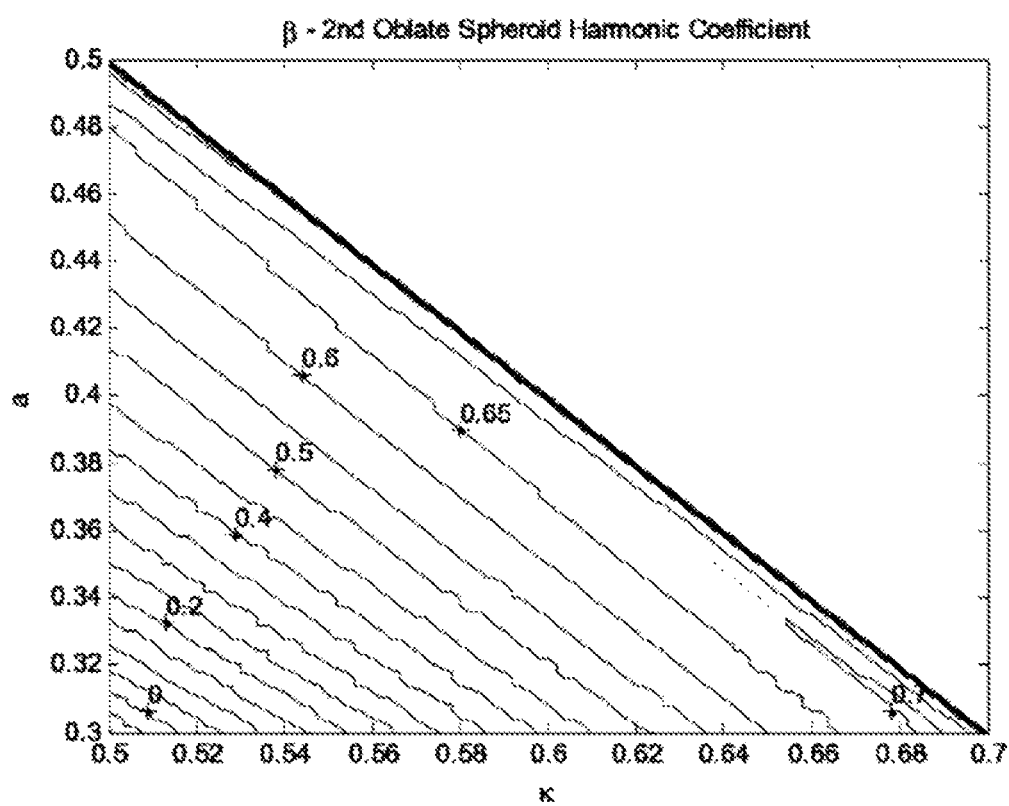
FIG. 25 is a graph of the $\beta$ distribution as a function of $\kappa$ and $\alpha$, for a minimum Q for an exemplary $(1-\alpha)P_0+\alpha$ oblate spheroid+$\beta$ $2^{nd}$ harmonic oblate spheroid charge antenna, according to an embodiment of this invention.
Figure 26:
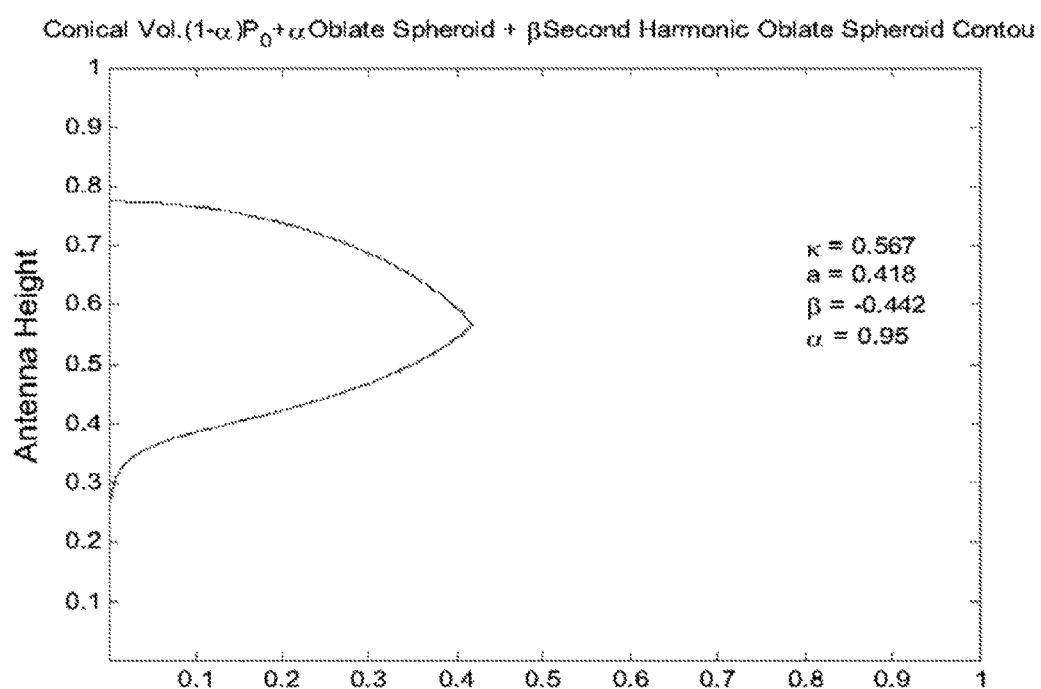
FIG. 26 is an illustration of the contour of an exemplary conical enclosing volume $(1-\alpha)P_0+\alpha$ oblate spheroid+$\beta$ $2^{nd}$ harmonic oblate spheroid charge antenna, according to an embodiment of this invention. This designs fits inside a 45° conical enclosing surface.

Using the inverted 45° cone, for example, a plot was generated of the $Q/Q_{Chu}$ ratio as a function of κ, α, β, and α as shown in FIG. 24. The parameter β is calculated to obtain the minimum value of Q. The conical volume is much smaller than the spherical volume and therefore the Q is understood to be much larger. Using higher resolution parameter steps of 0.0005, the antenna parameters were recalculated resulting in Q=37.386 at 50 MHz and h=½, $Q/Q_{Chu}$=5.3667, R=3.4287, C=24.832 pF for κ=0.5735, α=0.4235, β=0.615 with 95% of the charge on the top load. The numerical noise at this resolution is about ±0.0005 for the value of $Q/Q_{Chu}$. The top load parameter a was used to modify the antenna shape to fit our geometric constraints. As can be seen from the above results, the Q value is significantly less than the first ACD antenna's Q value. FIG. 25 is a plot of the β distribution as a function of κ and α for a minimum Q. FIG. 26 is an illustration of the contour of an exemplary conical enclosing volume (1−α) $P_0$+α oblate spheroid+β second harmonic on oblate spheroid charge antenna.

Figure 27:
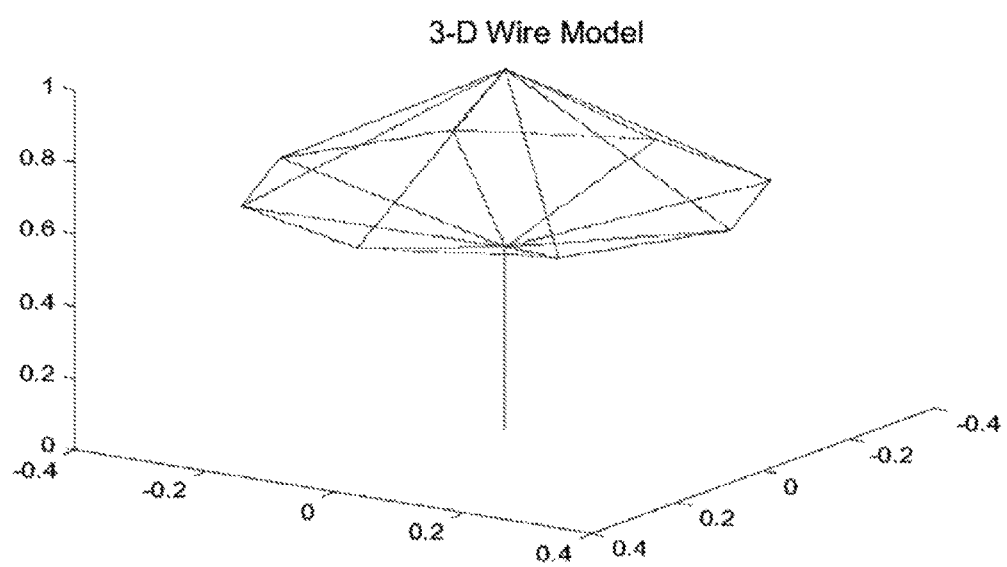
FIG. 27 is a 3-D rendering of a wire model of an exemplary $(1-\alpha)P_0+\alpha$ oblate spheroid+$\beta$ $2^{nd}$ harmonic oblate spheroid charge antenna, according to an embodiment of this invention.

A model of this antenna can be generated by using wire approximations. In general, this antenna can be approximated using 45° wires for the top portion with a wire tangential to the bottom surface of the antenna. Eight sets of wires can be used to approximate this antenna, with horizontal wires to connect the appropriate vertices. FIG. 27 is a 3-D rendering of a wire model of an exemplary 45 degree (1−α) $P_0$+α oblate spheroid+β second harmonic on oblate spheroid charge antenna. Though this antenna initially appears similar to prior art antennas, the subtle differences in its shape provides a superior performance.

Vertical Dipole

In the above examples, the antennas under study were principally monopole antennas of one form or another. In this embodiment, a dipole antenna is discussed. Of particular concern in electrical small antenna design is the loss caused by ground currents, which is often exacerbated in the case of a monopole antenna. The use of a dipole antenna reduces ground currents. The potential field for a dipole is calculated in principally the same manner as in the monopole case. The dipole is centered at z=h/2 and the image dipole is centered at z=−h/2. The length of the antenna arm is L=κh/2.

The calculation can be divided into two parts. The first part is with the dipole in free space, and the second part is with the image dipole. The top arm of the dipole is excited at a voltage. The other arm of the dipole is excited with the ground of the coaxial cable. The general potential field equation for such a structure is $$\Phi(\rho, z) = \frac{q}{4\pi\varepsilon_0 L} \ln\left(\frac{1+\tau}{1-\tau}\right), \quad (54)$$

For the free space dipole, the potential field is $$\Phi(\rho, z) = \frac{2q}{4\pi\varepsilon_0 \kappa h} \ln\left(\frac{(1+\tau_t)(1-\tau_b)}{(1-\tau_t)(1+\tau_b)}\right), \quad (55)$$

where $$\tau_t = \frac{\kappa h/2}{R_f + R_t}$$

is for the monopole, $$\tau_b = \frac{\kappa h/2}{R_f + R_b}$$

is for the image monopole, $R_t = \sqrt{(z-\kappa h/2-h/2)^2 + \rho^2}$ is the distance from $\rho$, z to the top of the monopole, $R_f = \sqrt{(z-h/2)^2 + \rho^2}$ is the distance from $\rho$, z to the feed point and $R_b = \sqrt{(z-h/2+\kappa h/2)^2 + \rho^2}$ is the distance from $\rho$, z to the bottom of the dipole.

The capacitance is computed by calculating the potential or voltage at $\rho=0$ and $z=h$. The above equations simplify to $R_t = (z-h/2-\kappa h/2)$, $R_f = z-h/2$, $R_b = (z-h/2+\kappa h/2)$, $$\tau_m = \frac{\kappa h/2}{2z - h - \kappa h/2}, \text{ and } \tau_i = \frac{\kappa h/2}{2z - h + \kappa h/2}$$

for $z \geq \kappa h$ resulting in $$\Phi(0, z) = \frac{2q}{4\pi\varepsilon_0 \kappa h} \ln\left(\frac{(2z-h)^2}{(2z-h-\kappa h)(2z-h+\kappa h)}\right). \quad (56)$$

This equation can be further simplified to yield $$\Phi(0, h) = \frac{2q}{4\pi\varepsilon_0 \kappa h} \ln\left(\frac{1}{(1-\kappa^2)}\right). \quad (57)$$

where $$\tau_{ti} = \frac{\kappa h/2}{R_f + R_t}$$

is for the monopole, $$\tau_{bi} = \frac{\kappa h/2}{R_f + R_b}$$

is for the image dipole, $R_t = \sqrt{(z-\kappa h/2+h/2)^2 + \rho^2}$ is the distance from $\rho$, z to the top of the image dipole, $R_f = \sqrt{(z+h/2)^2 + \rho^2}$ is the distance from $\rho$, z to the feed point of the image and $R_b = \sqrt{(z+h/2+\kappa h/2)^2 + \rho^2}$ is the distance from $\rho$, z to the bottom of the image dipole.

The capacitance is computed by calculating the potential or voltage at $\rho=0$ and $z=h$. The above equations simplify to $R_{ti} = (z+h/2-\kappa h/2)$, $R_{fi} = z+h/2$, $R_{bi} = (z+h/2+\kappa h/2)$, $$\tau_{ti} = \frac{\kappa h/2}{2z + h - \kappa h/2}, \text{ and } \tau_{bi} = \frac{\kappa h/2}{2z + h + \kappa h/2}$$

for $z \geq \kappa h$. The resulting expression for the potential field for the image dipole becomes $$\Phi(0, z) = \frac{2q}{4\pi\varepsilon_0 \kappa h} \ln\left(\frac{(2z+h)^2}{(2z+h-\kappa h)(2z+h+\kappa h)}\right) \quad (58)$$

which can be further simplified to $$\Phi(0, h) = \frac{2q}{4\pi\varepsilon_0 \kappa h} \ln\left(\frac{9}{(9-\kappa^2)}\right). \quad (59)$$

The combined potential from Eqs. 57 and 59 is $$\Phi(0, h) = \frac{2q}{4\pi\varepsilon_0 \kappa h} \ln\left(\frac{1}{1-\kappa^2} \frac{9}{9-\kappa^2}\right). \quad (60)$$

The capacitance becomes $$C(\kappa) = \frac{4\pi\varepsilon_0 \kappa h}{-2\ln((1-\kappa^2)(1-\kappa^2/9))}. \quad (61)$$

And the equation for radiation resistance becomes $$R_r = 40k^2 \left[\frac{\int_0^h zq(x)d^3x}{\int_{fp}^h q(x)d^3x}\right]^2, \quad (62)$$

where $q(z)$ is $$q(z) = 0 \text{ for } 0 \leq z < \frac{1-\kappa}{2}h \quad (63)$$

$$q(z) = -2q_0/\kappa h \text{ for } \frac{1-\kappa}{2}h \leq z < \frac{h}{2}$$

$$q(z) = 2q_0/\kappa h \text{ for } \frac{h}{2} \leq z \leq \frac{1+\kappa}{2}h$$

$$q(z) = 0 \text{ for } \frac{1+\kappa}{2}h < z \leq h.$$

Using a change in variables, $$z = x + \frac{h}{2},$$

and performing the following steps:

$$\int_0^h zq(z)dz = \int_0^{\kappa h/2} 2q_0/\kappa h\left(\frac{h}{2}+x\right)dx - \int_{-\kappa h/2}^0 2q_0/\kappa h\left(\frac{h}{2}+x\right)dx$$

$$\int_0^h zq(z)dz = 2q_0/\kappa h\left(\left[\frac{hx}{2}+\frac{x^2}{2}\right]_0^{\kappa h/2} - \left[\frac{hx}{2}+\frac{x^2}{2}\right]_{-\kappa h/2}^0\right)$$

$$\int_0^h zq(z)dz = 2q_0/\kappa h\left(\left[\frac{\kappa h^2}{4}+\frac{(\kappa h)^2}{8}\right] + \left[-\frac{\kappa h^2}{4}+\frac{(\kappa h)^2}{8}\right]\right)$$

$$\int_0^h zq(z)dz = q_0\kappa h/2$$

$$\int_{fp}^h q(z)dz = \int_0^{\kappa h/2} 2q_0/\kappa h\, dx = q_0,$$

results in Eq. 62 becoming $$R_e = 40\left(\frac{\kappa hk}{2}\right)^2. \qquad (64)$$

From the derivations shown above, the Q is found to be $$Q = \frac{-12\ln((1-\kappa^2)(1-\kappa^2/9))}{(\kappa hk)^3}. \qquad (65)$$

Figure 28:
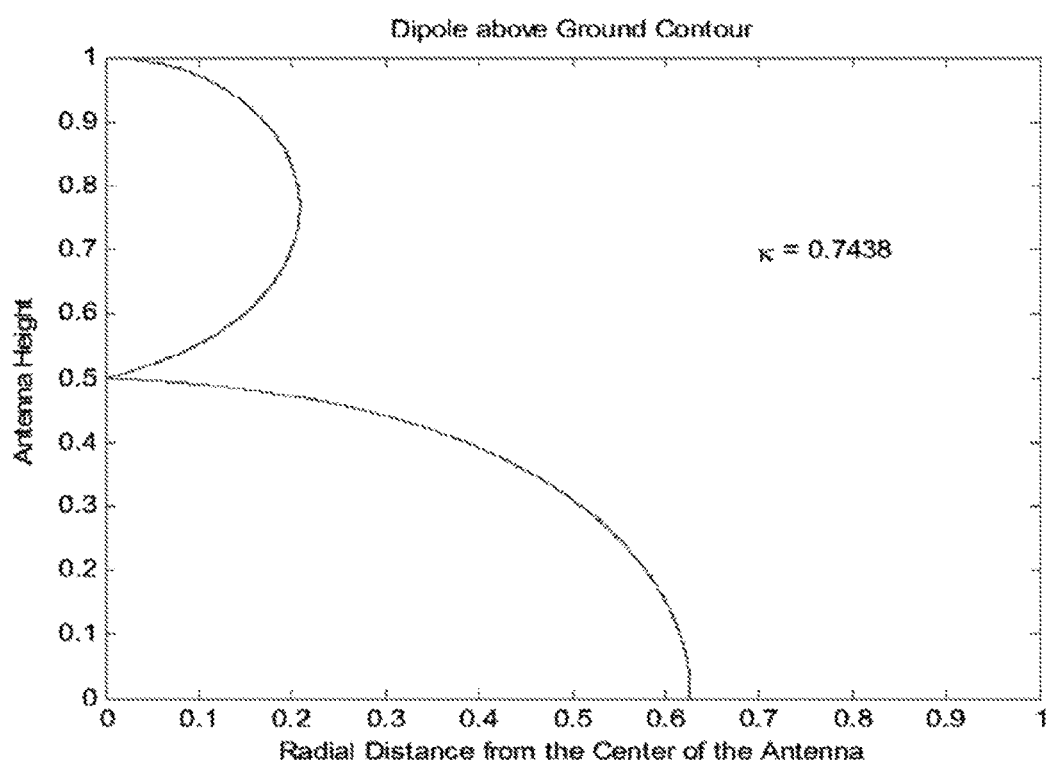
FIG. 28 is an illustration of the contour of an exemplary dipole antenna, according to an embodiment of this invention.

The minimum value of Q is at is κ=0.7437706. The resulting other antenna parameter values become $Q=12.67326/ka^3$ $h_{eff}=0.37188*h$ $R_r=5.5319(ka)^2$ $C=4.75458*10^{-11}*h$ Based on the above values, an exemplary dipole antenna having a minimum Q was designed. FIG. 28 is an illustration of the contour of an exemplary dipole, using the above parameters. It should be noted that the geometry of this exemplary dipole antenna approximates that of a prolate spheroid centered above the hemisphere of an oblate spheroid.

It should also be noted that, generally speaking, a cylindrically symmetric enclosing volume is the simplest case for monopole or linear-type antennas. However, as alluded to above, the enclosing volume can be of very general shapes, in addition to a cylindrically symmetric volume. For example, a rectangular enclosing volume could be used. Various harmonic or non-harmonic basis functions could be used for the topload. Complex line charge distributions could be used as elements.

Accordingly, by choosing a different enclosing volume shape, and tailoring basis functions to match that shape, it is possible to design a "flatter" antenna with a low Q. Flat antennas are of particular interest in the field of printed circuit card antennas or conformal antennas. For example, a possible design approach for a printed circuit card antenna is to project a three dimensional cylindrically symmetric antenna to a two dimensional antenna. (The two dimensional antenna is a slice of the three dimensional cylindrically symmetric antenna that includes the axis of rotation of the three dimensional cylindrically symmetric antenna.) Now, a spherical monopole becomes a disk monopole, as a gross approximation.

It should be also understood that a low Q, flatter antenna will have most of the charge on its edge. If one slices the flatter antenna to include the largest area, this will better approximate a printed circuit card antenna. The approach could improve the performance of the wire antenna, which was discussed above. The antenna could be any size and mounted on any object.

Figure 29:
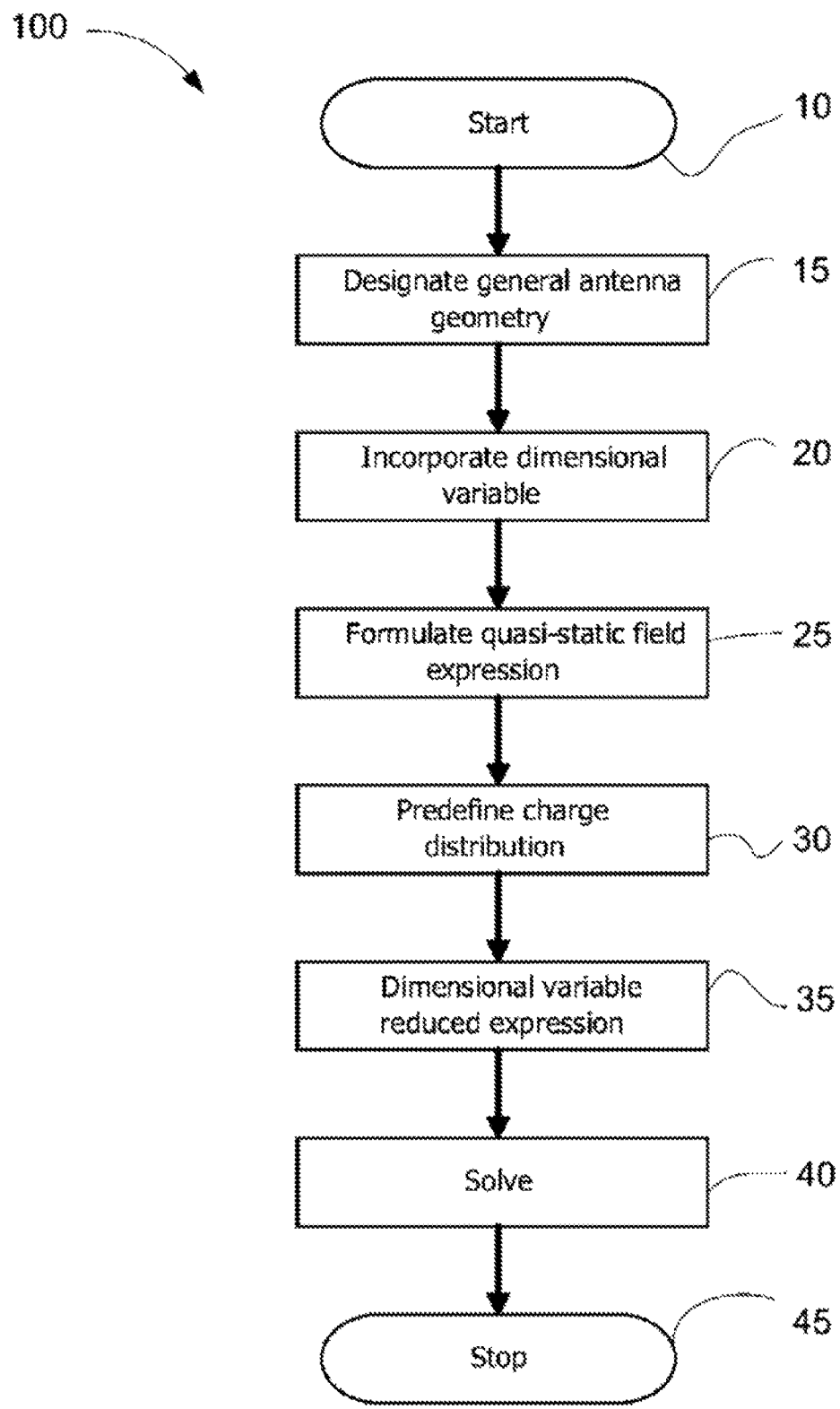
FIG. 29 is a flow chart illustrating an exemplary process for designing an antenna, according to an embodiment of this invention.

FIG. 29 is a flow chart illustrating an exemplary process in accordance with illustrative embodiments of this invention. The exemplary process 100 of FIG. 29 enables one of ordinary skill in the art to design electrically small antennas to have a desired Q as a function of a dimensional variable. By evaluating the Q as a function of the dimensional variable, the electrical parameters and contour(s) of a desired Q factor antenna can be designed. Judicially selecting the dimensional variable's value, antennas of varying Q's can be designed. In addition, by minimizing the Q-dimensional variable relationship, a minimum Q antenna can be arrived at.

The process shown in FIG. 29 is applicable both for the embodiments described above and the embodiments described below in the Section entitled "Dipole with Asymmetric Enclosing Surfaces", which is the subject of this disclosure.

Referring to FIG. 29, the exemplary process 100 begins 10 with designation of an electrically small antenna geometry 15 or a form factor corresponding to the antenna geometry 15. This designation is of general form and may simply be the establishment of a coordinate system that is consistent with the geometry chosen. Based on the type of antenna geometry 15 or form factor chosen, the exemplary process 100 incorporates a suitable dimensional variable 20 or a form factor related parameter. It is not necessary that the dimensional variable 20 or form factor related parameter be of a form that is consistent with the geometry's coordinate system, however, it would be preferred as this would obviate the need for a dimensional transformation. Proceeding from the dimensional variable 20 incorporation, the exemplary process 100 formulates quasi-static field equations 25. The quasi-static field equations 25 entail the application of Maxwell's formulas to result in a potential or scalar field equation(s) that relates the field intensities at field point(s) as a function of the source charge distribution.

Next, from the quasi-static field equation formulation 25 (and if the charge distribution is not already included), the exemplary process 100 impresses a given charge distribution 30 within the quasi-static field equation formulation 25. The given charge distribution 30 may be a single "type" charge distribution or of multiple "types", such as from differing basis functions. The charge distribution 30 may be different for different parts of the antenna geometry 15. This is explained in more detail with reference to the illustrative embodiment described below.

It should be appreciated that, depending on the complexity of the charge distribution 30 and the quasi-static field formulation 25, the order of the exemplary process 100 for these respective steps may be reversed, without departing from the spirit and scope of this invention. Accordingly, the exemplary process 100 may first impress a given charge distribution 30 in accordance with the antenna geometry 15 or form factor chosen, and then proceed to generate the quasi-static field equations 25, without loss of generality.

Presuming that the charge distribution 30 is performed subsequent to the quasi-static field equation formulation 25, the exemplary process 100 proceeds onto a dimensional variable-reduced expression 35 of the quasi-static field equation formulation 25. The dimensional variable-reduced expression 35 may simply be a reduced algebraic expression or a form that relates the Q of the antenna geometry in terms of the dimensional variable (form factor related parameter) or may take the form of another antenna parameter, such as the capacitance, for example. The capacitance is expressible in terms of the charge distribution and the dimensional variable (form factor related parameter). If expressed in terms of the capacitance, this dimensional variable-reduced expression 35 can be used to generate a Q expression, by appropriate use of a corresponding radiation resistance calculation.

The Q expression can then be solved 40 using a minimization and/or numerical technique to find a minimum Q or dimensional variable-to-Q correspondence. A plot of the computed capacitance and radiation resistance can be generated to correlate to given or desired Q values. By evaluating Q, the capacitance, the radiation resistance, and selecting the appropriate dimensional value(s) (form factor relater parameter(s), such as K) from among a plurality of antenna designs, design decisions can be made to meet the performance requirements of an antenna. The solved equation 40 will provide a value(s) of the dimensional variable(s) that generally operate to define the Q and geometry of a corresponding antenna. The exemplary process 100 then terminates at 45. The results of this exemplary process 100 can then be used to physically build or model an antenna that demonstrates the Q performance (and/or the capacitance and radiation resistance) chosen.

Dipole with Asymmetric Enclosing Surfaces

In various embodiments described above by way of introduction, the surfaces that enclose the dipole or monopole elements are assumed to have shapes that are symmetric with the contours of the dipole or monopole elements. Turning now to the illustrative embodiment which is the subject of this disclosure, an analytic antenna design is provided for a dipole or monopole antenna having an asymmetric enclosing surface (or asymmetric enclosing surfaces). This allows the antenna arm contours to fill a larger available volume. This results in a smaller Q factor, as can be seen from the equations below. A symmetric enclosing surface has a flat ground (scalar potential is zero at the ground). For an asymmetric enclosing surface, the ground, zero potential surface, is no longer flat. A monopole could be optimized for a curved ground surface. The non-symmetric enclosing surface creates a non-flat ground. The charge distribution of feed line determines the details near the feed point. The monopole topload is important at larger distances. As the equations below are directed toward a dipole, it is worth noting that the capacitance of a symmetric dipole is half the capacitance of a monopole, and the radiation resistance is twice the radiation resistance of a monopole.

In embodiments described above, the charge distribution is modeled as a sum of odd Legendre polynomials. The feed point is in the center of the charge distribution, and the dipole is symmetric.

According to an illustrative embodiment, the dipole is not symmetric. That is, the top arm is not symmetric with the bottom arm. The charge distribution geometries for the dipole arms have different parameters. According to one embodiment, the charge distribution geometries for the top and bottom arms have unequal lengths, e.g., $K_1$ for the top arm and $K_2$ for the bottom arm. Although only the lengths of the charge distribution geometries are discussed below, it should be appreciated that the charge distribution parameters need not be linear and may include any number of parameters that define the charge distribution geometries. The lengths are used as the charge distribution geometries in this example for ease of explanation.

In addition to different geometries, the charge distribution may have different properties. That is, the charge distribution may be linear, non-linear, constant, quadratic, etc. In the most general case, the charge distribution on each arm is a sum of contributions from all Legendre polynomials. Considering a linear charge distribution, the first charge distribution basis functions are:

$$q1_0(z) = \frac{q_{Net}}{K_1} \text{ for } z \geq 0 \tag{67}$$

$$q2_0(x) = \frac{q_{Net}}{K_2} \text{ for } x \leq 0 \tag{68}$$

where the subscript indicates the first basis function, and the 1 or 2 indicates the dipole arm. The net charge on both dipole arms is the qNet in the equations above. This first basis function is the dipole moment of the antenna. The effective height can be calculated from the dipole moment or potential on a sphere surrounding the antenna. The charge distribution on each arm can be redistributed with a Legendre polynomial. According to this embodiment, only the Legendre polynomials with order 2 and above are used. They do not contribute to the dipole of the antenna. Using a Legendre polynomial, the charge distribution along each dipole arm is given by:

$$q1_n(z) = P_n\left(\frac{z - \frac{K1}{2}}{\frac{K1}{2}}\right) \text{ for } K_1 > z \geq 0 \text{ and } n \geq 1 \tag{69}$$

$$q2_n(z) = P_n\left(\frac{-z - \frac{K2}{2}}{\frac{K2}{2}}\right) \text{ for } -K_2 \leq z \leq 0 \text{ and } n \geq 1 \tag{70}$$

The sign convention is selected to give $P_n(1)=1$ at the end of the charge distribution. The charge distribution for each arm is then given by:

$$q1(x) = q1_0 + \frac{1}{K_1}\sum_{i=1}^{N} A1_i q1_i \text{ for } K_1 \geq x > 0 \tag{71}$$

$$q2(x) = q2_0 + \frac{1}{K_2}\sum_{i=1}^{N} A2_i q2_i \text{ for } K_2 \leq x < 0 \tag{72}$$

The radiation resistance is computed from the dipole moment, as given by the equations below. The only terms that contribute to the integral are the constant $P_0$ and $P_1$. All of the other Legendre polynomials integrate to zero.

$$d_z = -\int_{-K_2}^{0} q2(z)z\,dz + \int_{0}^{K_1} q1(z)z\,dz$$

-continued $$d_z = -\frac{1}{q_{Net}} \int_{-K_2}^{0} \left[ \frac{q_{Net}}{K_2} + \frac{A2_1}{K_2}\left(\frac{-2z}{K_2} - 1\right) \right] z\,dz +$$

$$\frac{1}{q_{Net}} \int_{0}^{K_1} \left[ \frac{q_{Net}}{K_1} + \frac{A1_1}{K_1}\left(\frac{2z}{K_1} - 1\right) \right] z\,dz$$

$$d_z = K_2\left[\frac{1}{2} + \frac{A2_1}{6}\right] + K_1\left[\frac{1}{2} + \frac{A1_1}{6}\right]$$

$$R_{Rad} = 80\left(\frac{d_z/2}{2\pi\lambda}\right)^2$$

where $\lambda$ is the wavelength.

The capacitance is:

$$C = q_{Net}/(V1_{max} - V2_{min}) \tag{73}$$

where $V1_{max} > 0$ is the highest potential on the surface enclosing dipole arm 1 ($q_{Net} > 0$), and $V2_{min} < 0$ is the lowest potential on the surface enclosing dipole arm 2 ($q_{Net} < 0$). The Q factor is computed from:

$$Q = \frac{1}{\omega R_{Rad} C} \tag{74}$$

In this general case, it is assumed that the equipotential surface encloses the charge distribution on each arm. The equipotential surface will be an ideal conductor or antenna arm. Some values of $A1_n$ and $A2_n$ will need to be excluded from the minimization of Q.

Based on the equations above, a set of antenna designs may be generated, each antenna design having unique charge distribution geometries and properties for the top arm and the bottom arm. The capacitance, radiation resistance, and the Q-factor can be generated for each design. The antenna design that results in the desired capacitance, radiation resistance, and/or Q-factor may be selected as the antenna design. The contour of the dipole antenna will depend on the unique charge distribution geometry and properties for the chosen antenna design. The process of generating the set of antenna designs and selecting the optimal antenna design may be performed according to steps illustrated and described above with reference to FIG. 29.

It should be appreciated that a top load can be added to each line charge distribution. The top loads can also be tilted. In addition, the charge distribution basis functions do not need to be orthogonal. The basis functions can be tilted to model a non-symmetric dipole. Further, the source disks do not need to be parallel, the potentials can be numerically calculated, and the charge distribution basis function can distribute the charge on a cone instead of a line.

Figure 30:
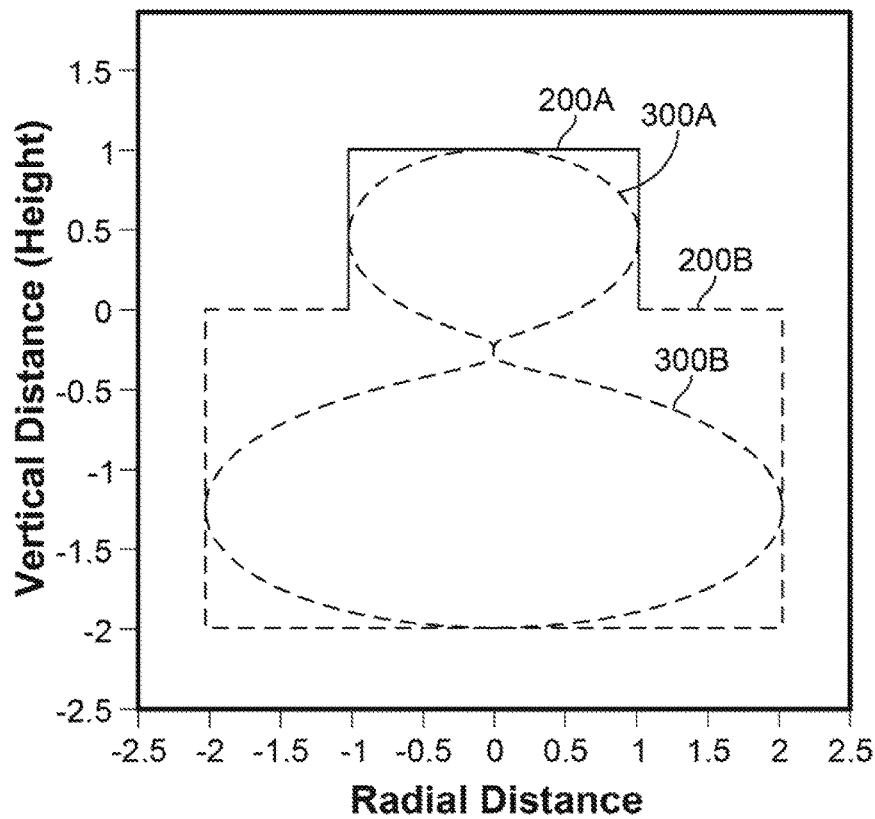
FIG. 30 illustrates an example contour of a dipole antenna with asymmetrical enclosing surfaces according to an illustrative embodiment.

FIG. 30 illustrates an example of a contour of a dipole with asymmetrical enclosing surfaces designed given the methodology above. As can be seen from FIG. 30, the shape of top enclosing surface 200A which encloses the top arm 300A is not symmetrical with the contour of the top arm. Also, the shape of the bottom enclosing surface 200B which encloses the bottom arm 300B is not symmetrical with contour of the bottom arm. In the embodiment of the dipole with asymmetrical enclosing surfaces shown in FIG. 30, the top arm 300A touches the top enclosing surface 200A at more than one point, and the bottom arm 300B touches the bottom enclosing surface 200B at more than one point.

Figure 31:
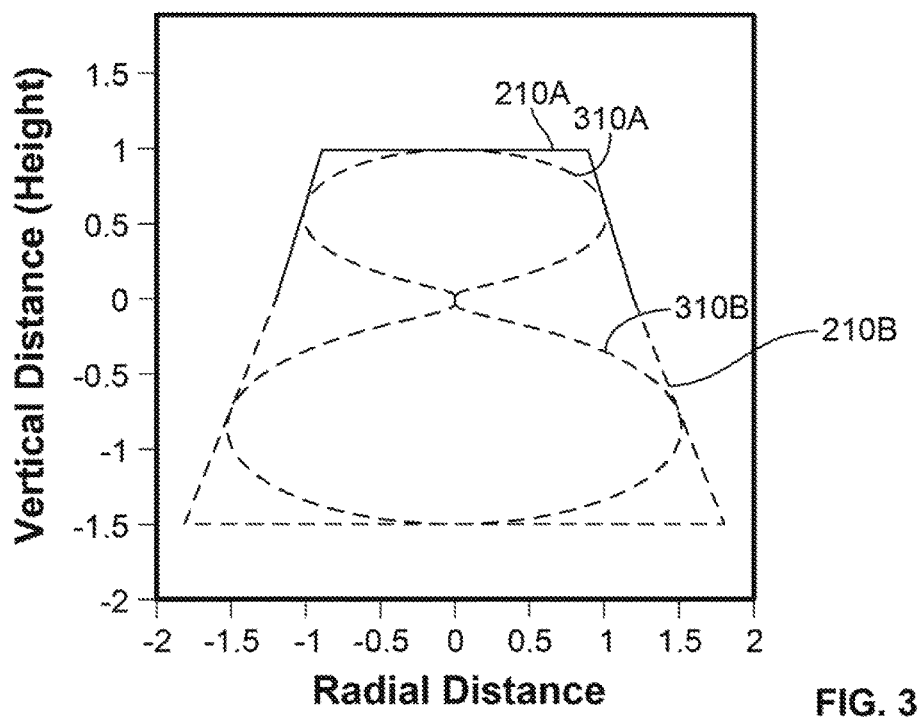
FIG. 31 illustrates another example contour of a dipole antenna with asymmetrical enclosing surfaces according to an illustrative embodiment.

FIG. 31 illustrates another example of a contour of a dipole with asymmetrical enclosing surfaces according to this embodiment. As can be seen from FIG. 31, the shape of the top enclosing surface 210A which encloses the top arm 310A is not symmetrical with the contour of the top arm. Also the shape of the bottom enclosing surface 210B which encloses the bottom arm 310B is not symmetrical with contour of the bottom arm. In the embodiment of the dipole with asymmetrical enclosing surfaces shown in FIG. 31, the top arm 310A touches the top enclosing surface 210A at more than one point, and the bottom arm 310B touches the bottom enclosing surface 210B at more than one point.

The above analysis assumes that the location of the feed point is known. In the general case, the feed point could be an independent degree of freedom.

The quasi-static antenna design process described above allows both large and small arms to be simultaneously optimized to obtain better performance. Small changes in antenna shape can provide a significant improvement in performance, as demonstrated in the example described below.

The analysis described above is directed to the general charge distribution being linear. For ease of understanding, a simple example of a dipole antenna having asymmetric enclosing surfaces is described below, with the charge distribution being constant.

In the following example, the top enclosing surface is predesignated as being a 1-meter (1 m) radius sphere for enclosing the top dipole arm, and the bottom enclosing surface predesignated as being a 2-meter (2 m) radius sphere for the enclosing bottom dipole arm. The lengths of the dipole arms are then set at 1-meter for the top dipole arm and 2-meters for the bottom dipole arm. The shapes of the dipole arms will depend on the antenna design that is selected to provide the best performance in terms of capacitance, radiation resistance, and/or the Q-factor.

Also, the wavelength is selected to be very large compared to the antenna size. This approach assumes that the antenna is electrically small and the frequency is below the antenna's first resonate frequency. The frequency performance is determined by performing numerical electromagnetic modelling. The wavelength is given as $\lambda$–40 meters, and the frequency is 7.5 MHz. It should be appreciated that these parameters are given by way of example only. In addition to a sphere, the enclosing surfaces may have any suitable shape, such as but not limited to a cone, a rectangle, a square, etc.

According to this embodiment, the charge distribution is a constant Asymptotic Conical Dipole (ACD) distribution with the charge distribution geometry having a length of $K_{Top} < 1$ for the top arm and the charge distribution geometry having a length of $K_{Bottom} < 2$ for the bottom arm. The charge distribution on the z-axis is given by.

$$q(z) = q_{Net}/K_{Top}, \text{ for } 0 \leq z \leq \kappa_{Top} \tag{75}$$

$$q(z) = -q_{Net}/\kappa_{Bottom}, \text{ for } 0 \leq -z \leq \kappa_{Bottom} \tag{76}$$

where $q(z)=0$ for all other values of z, $N_{et}$ is the net charge on the top dipole arm and the net charge on the bottom dipole arm is $q_{Net\ Bot} = -q_{net}$. For notational simplicity $-q_{Net}$ is used for the charge on the bottom arm.

The quasi-static potential for the non-symmetric quasistatic dipole model is:

$$\Psi = \frac{q_{Net}}{4\pi\varepsilon_0 \kappa_{Top}} \ln\left(\frac{1+\delta_{Top}}{1-\delta_{Top}}\right) - \frac{q_{Net}}{4\pi\varepsilon_0 \kappa_{Bottom}} \ln\left(\frac{1+\delta_{Bottom}}{1-\delta_{Bottom}}\right) \tag{77}$$

where $$\varepsilon_0 = \frac{10^7}{4\pi c^2}$$

(Feynman's Lectures on Physics) results in:

$$\delta_{Top} = \kappa_{Top}/(R_{Top}+R_{fp}) \tag{78}$$

$$\delta_{Bottom} = \kappa_{Bottom}/(R_{Bottom}+R_{fp}) \tag{79}$$

where the distance $R_{Top}$ from $\rho,z$ the top of the wire, the distance $R_{fp}$ from $\rho,z$ to the feedpoint, and the distance $R_{Bottom}$ from $\rho,z$: to the bottom dipole are given by:

$$R_{Top} = \sqrt{(z-\kappa_{Top})^2+\rho^2} \tag{80}$$

$$R_{fp} = \sqrt{z^2+\rho^2} \tag{81}$$

$$R_{Bottom} = \sqrt{(z+\kappa_{Bottom})^2+\rho^2} \tag{82}$$

The capacitance is computed from the potential difference between the dipole arms as:

$$C = q_{Net}/(\Psi_{Max}-\Psi_{Min}) \tag{83}$$

The potential will have a maximum value $\Psi_{Max}$=maximum ($\Psi(z_{Top},\rho_{Top})$) on the top sphere $z_{Top}$=A cos($\theta$) and $\rho_{Top}$=A sin($\theta$) where $0 \leq \theta \leq \pi/2$ where A is the radius of the top sphere. The potential on the bottom sphere is negative. The smallest negative value is $\Psi_{Min}$=minimum ($\Psi(z_{Bottom}, \rho_{Bottom})$) will be evaluated on the bottom sphere sphere $z_{Bottom}$=−B cos($\theta$) and $\rho_{Bottom}$=B sin($\theta$) where $0 \leq \theta \leq \pi/2$ where B is the radius of the bottom sphere.

The normalized dipole moment is obtained by integration:

$$d_z = \frac{1}{q_{Net}} \int_{\kappa_{Bottom}}^{\kappa_{Top}} q(z)dz \tag{84}$$

$$d_z = \kappa_{Top}/2 + \kappa_{Bottom}/2$$

The radiation resistance, $R_{Rad}$ is computed from the normalized dipole moment of the charge distribution as.

$$R_{Rad} = 80\left(\frac{d_z/2}{2\pi\lambda}\right)^2 \tag{85}$$

The Q-factor is computed from the capacitance and the radiation resistance (given in Eqn. 74 and repeated here) as:

$$Q = \frac{1}{\omega R_{Rad} C}$$

The above equations are used to generate design curves for an antenna geometry. The solution for this particular example is.

$\kappa_{Top}$=0.50111

$\kappa_{Bottom}$=1.67656

$Q_{min}$=470.38

$C$=77.111 pF $R_{Res}$=0.58505

Figure 32A:
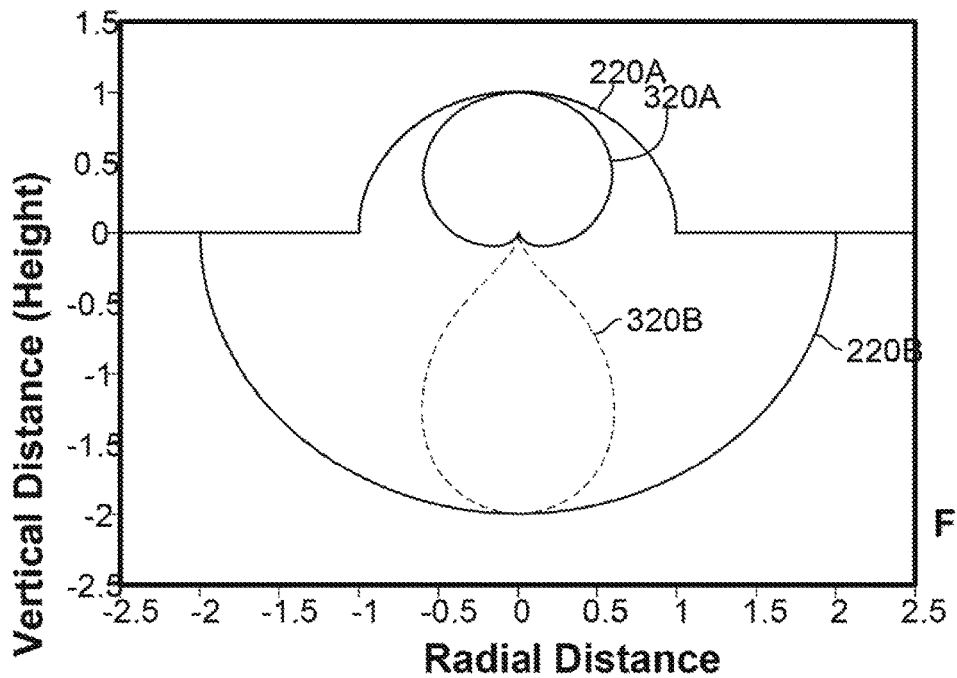
FIGS. 32A and 32B illustrate other example contours of a dipole antenna with asymmetrical enclosing surfaces according to illustrative embodiments.

FIG. 32A illustrates an example of a contour of a dipole with asymmetrical enclosing surfaces derived from the equations above. As can be seen from FIG. 32A, the shape of the top enclosing surface 220A which encloses the top arm 320A is not symmetrical with the shape of the bottom enclosing surface 220B which encloses the bottom arm 320B. Also, the contours of the top arm 320A and the bottom arm 320B are not symmetrical. Although the shapes of the enclosing surfaces 220A and 220B are spherical, it should be appreciated that the enclosing surfaces may be rectangular, triangular, conical, or any other shape as long as the antenna arms are enclosed.

Figure 32B:
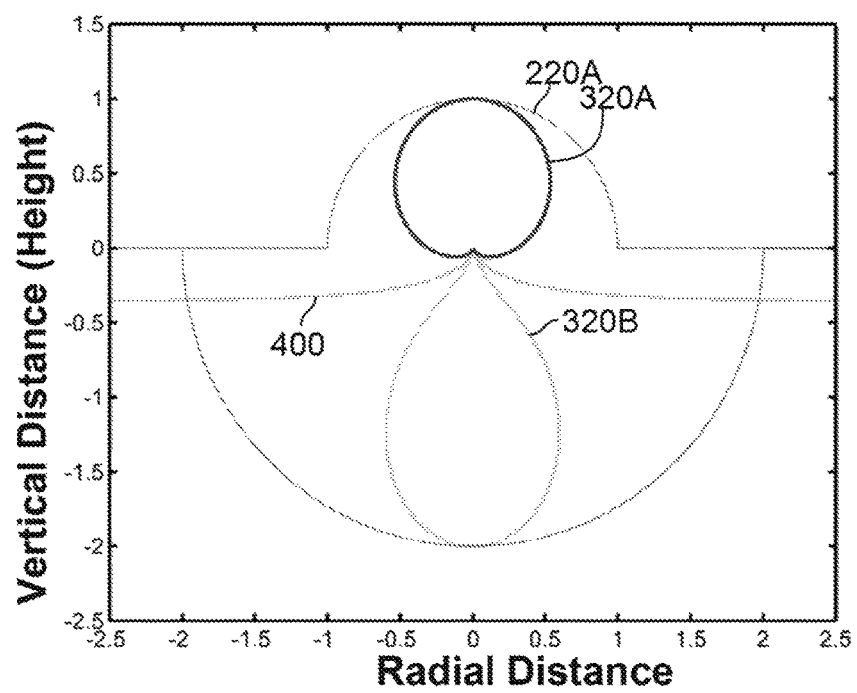

As can be seen from FIG. 32A, according to this embodiment, the top arm touches the top enclosing surface at one point, and the bottom arm touches the bottom enclosing surface at one point. This decreases the potential and increases the capacitance. FIG. 32B illustrates another example of a contour of a dipole with asymmetrical enclosing surfaces having a non-flat ground 400.

Figure 33:
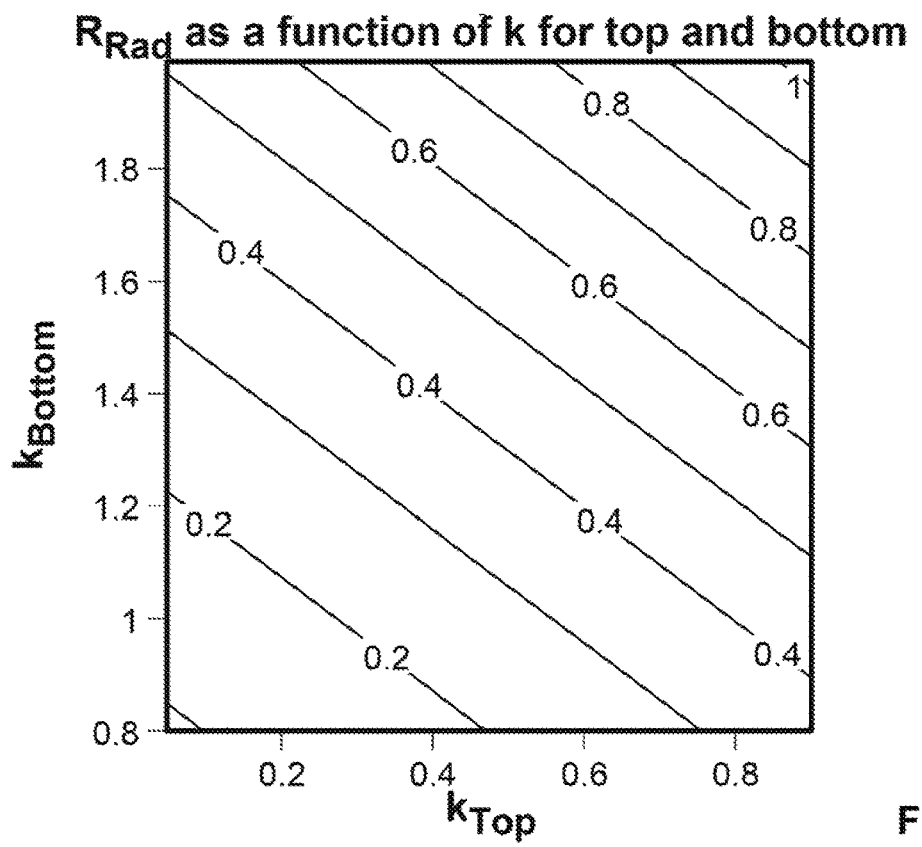
FIG. 33 is a graph of radiation resistance as a function of charge distribution lengths for an asymmetric dipole according to an illustrative embodiment.
Figure 34:
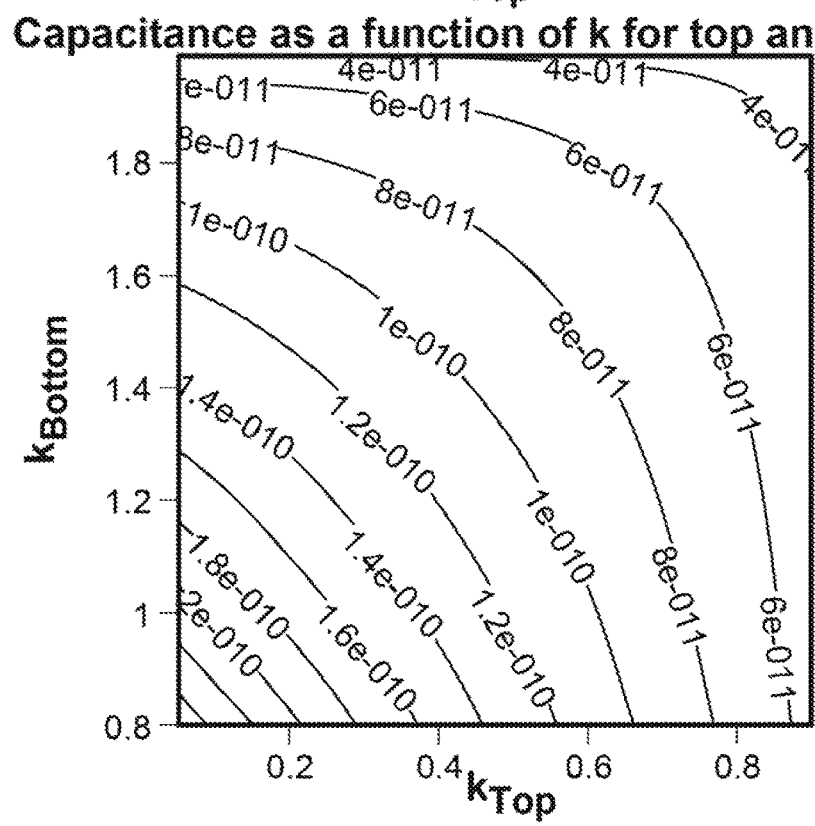
FIG. 34 is a graph of capacitance as a function of charge distribution lengths for an asymmetric dipole according to an illustrative embodiment.
Figure 35:
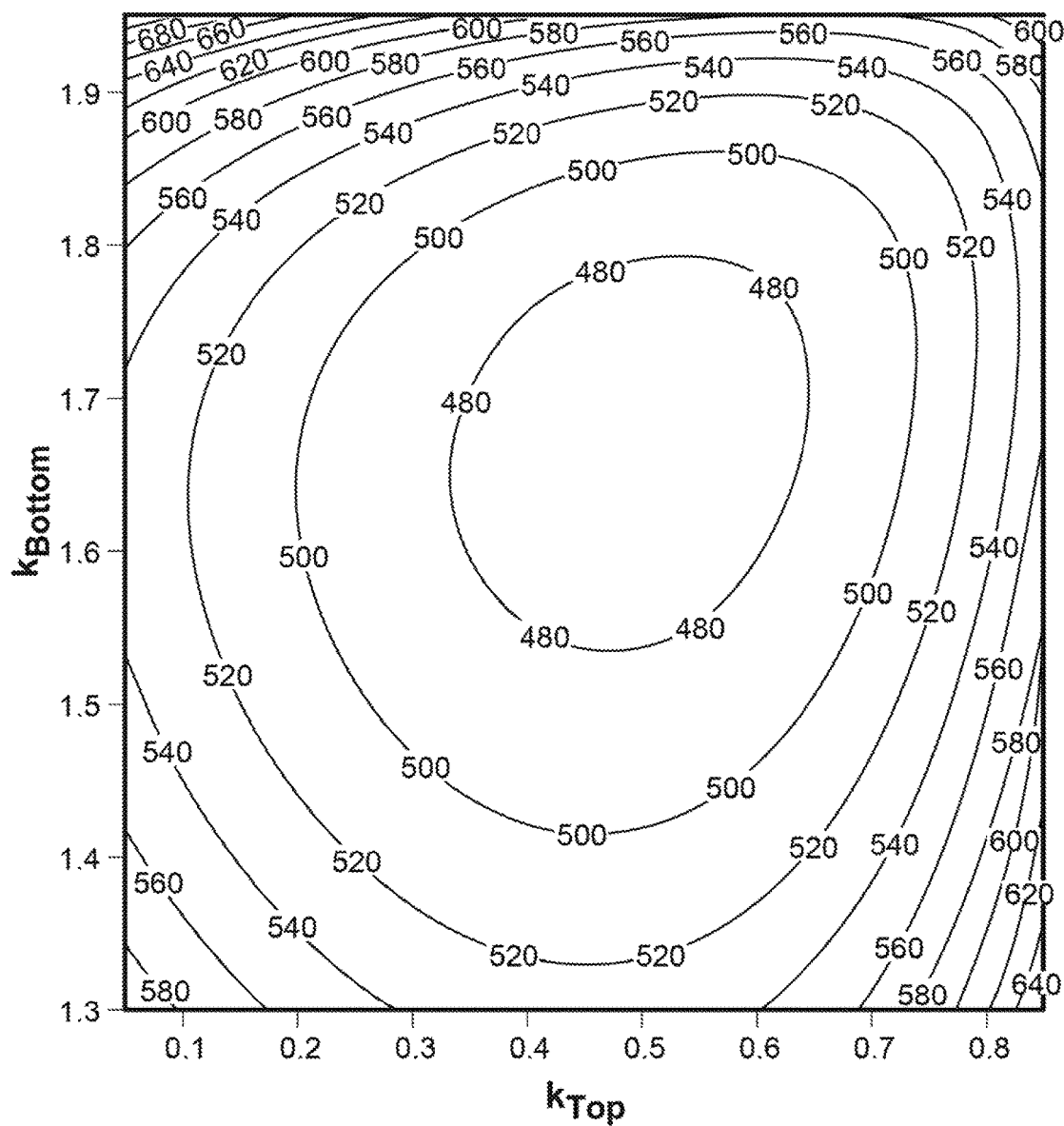
FIG. 35 is a graph of a Q-factor ratio as a function of charge distribution lengths for an asymmetric dipole according to an illustrative embodiment.
Figure 36:
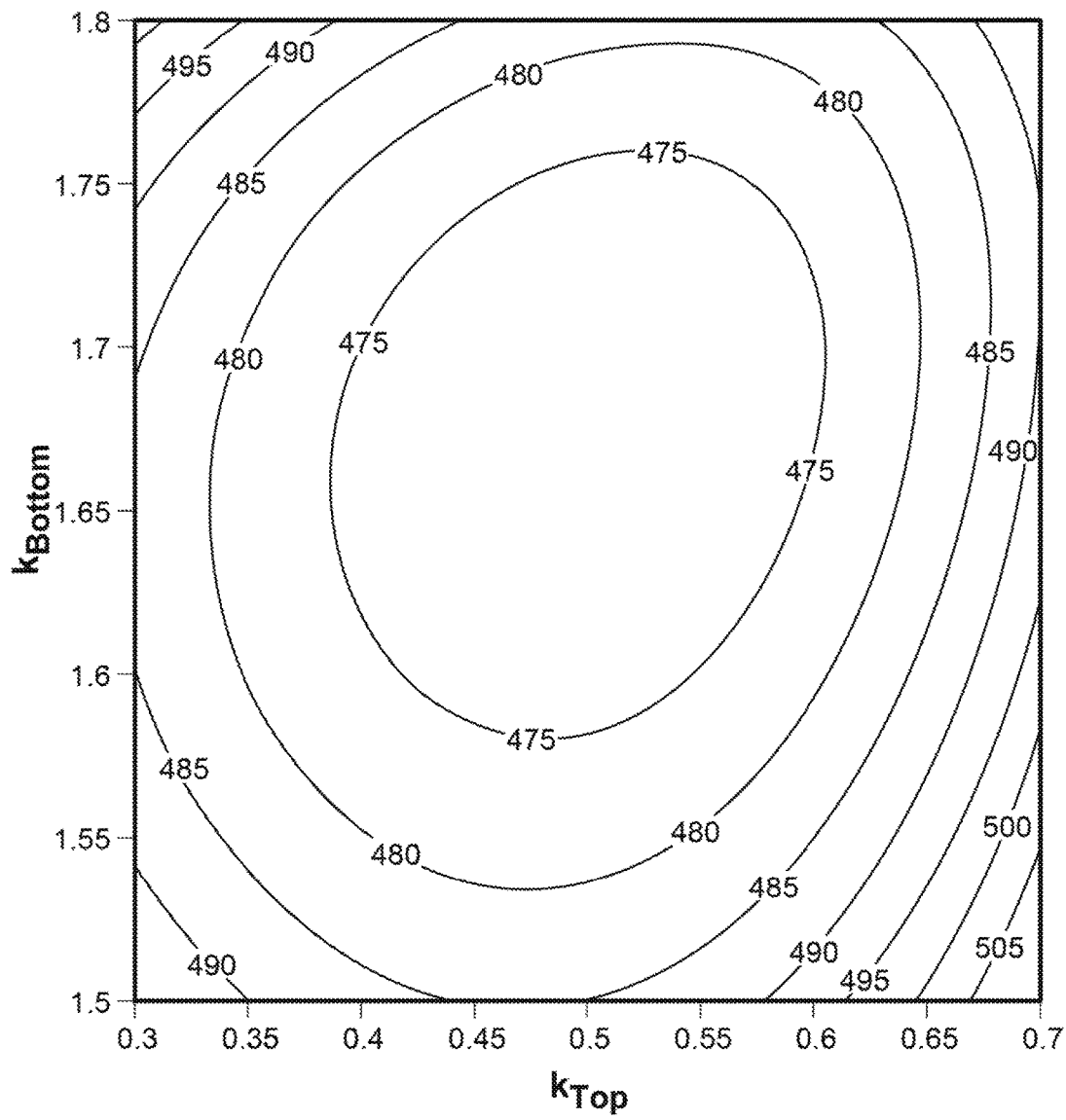
FIG. 36 is an expanded plot of the Q-factor ratio shown in FIG. 35 according to an illustrative embodiment.

FIG. 33 is a graph of radiation resistance as a function of dipole arm lengths for an asymmetric dipole according to this embodiment. FIG. 34 is a graph of capacitance as a function of dipole arm lengths according to this embodiment. FIG. 35 is a graph of a Q-factor ratio as a function of dipole arm lengths for an asymmetric dipole according to an illustrative embodiment. FIG. 36 is an expanded plot of the Q-factor ratio shown in FIG. 35 according to an illustrative embodiment. For each of these graphs, the length $K_{top}$ of the top arm is less than 1 m, and the length $K_{bottom}$ of the bottom arm is less than 2 m. As can be seen from FIGS. 35 and 36, the Q factor is optimally minimal around $K_{top}$=0.5 and $K_{bottom}$=1.7.

Although in the example described above, the bottom arm is larger than the top arm, it should be appreciated that the top arm may be larger than the bottom arm (with appropriate modifications to the equations).

Although not illustrated, it should be appreciated that various calculations described in the embodiments above may be performed by a processor executing computer readable instructions which may be stored on a non-transitory storage medium.

The foregoing description of various embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for designing an electrically small asymmetric dipole antenna, comprising:
   determining a capacitance, a radiation resistance, and a Q factor for each dipole antenna design among a set of dipole antenna designs, wherein the Q factor for each dipole antenna design is determined as a function of the capacitance and the radiation resistance, wherein each dipole antenna design has a unique charge distribution geometry and charge distribution properties, and wherein, for each dipole antenna design, a predefined shape of a top enclosing surface is not symmetrical with a contour of the top arm, and a predefined shape of a bottom enclosing surface is not symmetrical with a contour of the bottom arm;

selecting a dipole antenna design from among the set of dipole antenna designs that produces a capacitance and a radiation resistance that result in a minimum Q factor;

if the minimum Q factor meets performance requirements, building the electrically small asymmetric dipole antenna based on the selected dipole antenna design; and mounting the electrically small asymmetric dipole antenna to a non-flat ground such that the bottom arm is mounted below the non-flat ground and the top arm is mounted above the non-flat ground.

2. The method of claim 1, wherein, for each dipole antenna design, the contour of the top arm is not symmetrical with the contour of the bottom arm.

3. The method of claim 1, wherein, for each dipole antenna design, a length of the top arm is not equal to a length of the bottom arm.

4. The method of claim 1, wherein determining the capacitance for each dipole antenna design includes:

determining the unique charge distribution geometry and the charge distribution properties for the antenna design;

determining a quasi-static potential based on the unique charge distribution geometry and the charge distribution properties; and determining the capacitance as a function of the quasi-static potential.

5. The method of claim 4, wherein determining the unique charge distribution geometry and the charge distribution properties for each dipole antenna design includes:

determining a unique charge distribution geometry and charge distribution properties for the top arm of the antenna design; and determining a unique charge distribution geometry and charge distribution properties for the bottom arm of the antenna design.

6. The method of claim 4, wherein, for each dipole antenna design, the quasi-static potential is further determined based on a length of the unique charge distribution geometry and the charge distribution properties of the top arm and a length of the unique charge distribution geometry and the charge distribution properties of the bottom arm.

7. The method of claim 1, wherein the radiation resistance for each dipole antenna design is determined as a function of a radius of the bottom enclosing surface for the dipole antenna design.

8. A method for designing an electrically small asymmetric dipole antenna, comprising:

receiving, by a processor, a designation of a shape of a top enclosing surface for enclosing a top arm of the dipole antenna;

receiving, by the processor, a designation of a shape of a bottom enclosing surface for enclosing a bottom arm of the dipole antenna;

determining, by the processor, a capacitance, a radiation resistance, and a Q factor for each dipole antenna design among a set of dipole antenna designs, wherein the Q factor for each dipole antenna design is determined as a function of the capacitance and the radiation resistance, wherein each dipole antenna design has a unique charge distribution geometry and charge distribution properties, and wherein, for each dipole antenna design, the shape of the top enclosing surface is not symmetrical with a contour of the top arm, and the shape of the bottom enclosing surface is not symmetrical with a contour of the bottom arm; and selecting a dipole antenna design from among the set of dipole antenna designs that produces a capacitance and a radiation resistance that result in a minimum Q factor;

if the minimum Q factor meets performance requirements, building the electrically small asymmetric dipole antenna based on the selected dipole antenna design; and mounting the electrically small asymmetric dipole antenna to a non-flat ground such that the bottom arm is mounted below the non-flat ground and the top arm is mounted above the non-flat ground.

9. The method of claim 8, wherein determining the capacitance for each dipole antenna design includes:

determining the unique charge distribution geometry and charge distribution properties for the antenna design;

determining a quasi-static potential based on the unique charge distribution geometry and the charge distribution properties; and computing the capacitance as a function of the quasi-static potential.

10. A method for designing an electrically small asymmetric dipole antenna, comprising:

designating an electrically small antenna geometry having a top arm, a top enclosing surface, a bottom arm, and a bottom enclosing surface, wherein a shape of the top enclosing surface is not symmetrical with a contour of the top arm, and a shape of the bottom enclosing surface is not symmetrical with a contour of the bottom arm;

incorporating a dimensional variable based on the designated geometry;

formulating, by a processor, a quasi-static field equation derived from Maxwell's formulas to result in a potential, wherein the potential relates field intensities at field points as a function of a source charge distribution;

impressing given charge distributions for the top and bottom arms within the quasi-static field equation;

converting the quasi-static field equation to a dimensional variable-reduced expression that relates the Q of the designated geometry in terms of the dimensional variable;

solving, by the processor, the dimensional variable-reduced expression to find a minimum Q;

if the minimum Q meets performance requirements, building the electrically small asymmetric dipole antenna based on the designated geometry; and mounting the electrically small asymmetric dipole antenna to a non-flat ground such that the bottom arm is mounted below the non-flat ground and the top arm is mounted above the non-flat ground.

* * * * *